(12) United States Patent
Smith et al.

(10) Patent No.: US 9,279,839 B2
(45) Date of Patent: *Mar. 8, 2016

(54) DOMAIN IDENTIFICATION AND SEPARATION FOR PRECISION MEASUREMENT OF WAVEFORMS

(75) Inventors: Paul Reed Smith, Annapolis, MD (US); Jack W. Smith, Belle Haven, VA (US); Ernestine M. Smith, legal representative, Belle Haven, VA (US); F. Michael Slay, Okatie, SC (US); Shane G. W. Morris, Owings Mills, MD (US)

(73) Assignee: Digital Harmonic LLC, Stevensville, MD (US)

( * ) Notice: Subject to any disclaimer, the term of this patent is extended or adjusted under 35 U.S.C. 154(b) by 969 days.

This patent is subject to a terminal disclaimer.

(21) Appl. No.: 13/509,420

(22) PCT Filed: Nov. 11, 2010

(86) PCT No.: PCT/US2010/056333
§ 371 (c)(1),
(2), (4) Date: Jul. 11, 2012

(87) PCT Pub. No.: WO2011/060130
PCT Pub. Date: May 19, 2011

(65) Prior Publication Data
US 2013/0191062 A1    Jul. 25, 2013

Related U.S. Application Data

(60) Provisional application No. 61/379,092, filed on Sep. 1, 2010.

(51) Int. Cl.
*G01R 23/02* (2006.01)
*G06F 12/02* (2006.01)
(Continued)

(52) U.S. Cl.
CPC ............ *G01R 23/02* (2013.01); *G06F 12/0207* (2013.01); *G06F 17/141* (2013.01); *G06F 17/16* (2013.01)

(58) Field of Classification Search
None
See application file for complete search history.

(56) References Cited

U.S. PATENT DOCUMENTS

| 4,797,923 A | 1/1989 | Clarke |
| 4,884,229 A | 11/1989 | Dekker |

(Continued)

FOREIGN PATENT DOCUMENTS

| EP | 0 847 153 A3 | 7/1999 |
| EP | 1 184 670 A2 | 3/2002 |

(Continued)

OTHER PUBLICATIONS

U.S. Appl. No. 61/118,198, Smith et al., "Precision Measuring Matrix," filed Nov. 26, 2001.

(Continued)

*Primary Examiner* — Michael D Yaary
(74) *Attorney, Agent, or Firm* — Sterne, Kessler, Goldstein & Fox PLLC

(57) ABSTRACT

A machine-implemented method for computerized digital signal processing obtains a digital signal from data storage or from conversion of an analog signal and determines, from the digital signal, Measuring Matrices (MM). Each measuring matrix has a plurality of cells, each cell having an amplitude corresponding to the signal energy in a frequency bin for a time slice. Cells in each measuring matrix having maximum amplitudes within a time slice are identified as maximum cells. Maxima that coincide in time and frequency are identified and a correlated maxima matrix (PMM) is constructed showing the coinciding maxima and the adjacent marked maxima are linked into partial chains. If only one MM is constructed, multiple types of maxima are identified to generate the (PMM). The partial chains are isolated by parameters for a single domain or multiple domains to identify partial chains and possible separation of complex compound waveforms in the digital signal.

28 Claims, 16 Drawing Sheets
(14 of 16 Drawing Sheet(s) Filed in Color)

(51) Int. Cl.
*G06F 17/16* (2006.01)
*G06F 17/14* (2006.01)

(56) References Cited

U.S. PATENT DOCUMENTS

| | | | |
|---|---|---|---|
| 5,640,490 A | | 6/1997 | Hansen et al. |
| 5,780,759 A | | 7/1998 | Szalay |
| 6,766,288 B1 | | 7/2004 | Smith |
| 6,798,886 B1 | | 9/2004 | Smith et al. |
| 7,003,120 B1 | | 2/2006 | Smith et al. |
| 7,788,066 B2 | * | 8/2010 | Taenzer ............... H01Q 25/02 181/125 |
| 8,050,397 B1 | * | 11/2011 | Read ...................... H04Q 1/457 379/283 |
| 8,620,976 B2 | | 12/2013 | Smith et al. |
| 2001/0045153 A1 | | 11/2001 | Alexander et al. |
| 2003/0061035 A1 | | 3/2003 | Kadambe |
| 2003/0223354 A1 | | 12/2003 | Olszewski |
| 2004/0243657 A1 | | 12/2004 | Goren et al. |
| 2005/0265431 A1 | | 12/2005 | Pietila et al. |
| 2006/0111801 A1 | | 5/2006 | Weare et al. |
| 2006/0265218 A1 | | 11/2006 | Samadani |
| 2007/0286430 A1 | | 12/2007 | Thomas et al. |
| 2008/0019538 A1 | | 1/2008 | Kushner et al. |
| 2008/0034870 A1 | | 2/2008 | Kurt-Elli |
| 2008/0228470 A1 | | 9/2008 | Hiroe |
| 2009/0285409 A1 | | 11/2009 | Yoshizawa et al. |
| 2012/0041994 A1 | | 2/2012 | Smith et al. |
| 2013/0046805 A1 | | 2/2013 | Smith et al. |
| 2014/0351302 A1 | | 11/2014 | Smith et al. |

FOREIGN PATENT DOCUMENTS

| | | |
|---|---|---|
| JP | 3174777 B2 | 3/2001 |
| JP | 2003-131688 A | 5/2003 |
| JP | 2006-048195 A | 2/2006 |
| JP | 2006-251712 A | 9/2006 |
| JP | 2007-304445 A | 11/2007 |
| JP | 2008-310138 A | 12/2008 |
| JP | 2009-169439 A | 7/2009 |
| WO | WO 2008/056649 A1 | 5/2008 |
| WO | WO 2011/060145 | 5/2011 |

OTHER PUBLICATIONS

"Exponential Smoothing," accessed from Wikipedia.org, Oct. 17, 2007, pp. 1-3.

Fladung, W., et al., "Application and Correction of the Exponential Window for Frequency Response Functions," *Mechanical Systems and Signal Processing*, vol. 11, No. 1, 1997; pp. 23-36.

Gasior, M., et al., "Improving FFT Frequency Measurement Resolution by Parabolic and Gaussian Interpolation," European Organization for Nuclear Research, CERN-AB Division, AB-Note-2004-021 BDI; 1 pages.

Jensen, K., "Timbre Models of Musical Sounds," Department of Computer Sciences of the University of Copenhagen (DIKU), 1999; 247 pages.

NIST, National Institute of Standards and Technology, Double Exponential Smoothing, Oct. 17, 2000, pp. 1-2.

Vincent, E., "Musical Source Separation Using Time-Frequency Source Priors," *IEEE Transactions on Audio, Speech and Language Processing*, vol. 14, No. 1, Jan. 2006, 8 pages.

Wu, Z., et al., "Ensemble Emperical Mode Decomposition: A Noise Assisted Data Analysis Method," Aug. 2005; pp. 1-49.

Supplemental Eurpoean Search Report directed to related European Patent Application No. 09851007.6-1507, mailed Oct. 6, 2014; 7 pages.

Casey, C.A., "Auditory Group Theory with Applications to Statistical Basis Methods for Structured Audio," *Submitted to the Program in Media Arts and Sciences, School of Architecture and Planning in Partial Fulfillment of the Requirements for the Degree of Doctor of Philosophy*, p. 1-180, Massachusetts Institute of Technology, United States (1998).

De Haan, J.M., "A Survey on Methods for Time-Frequency Anaylsis," *Master of Science program in Electrical Engineering*, p. 1-106, University of Karlskrona/Ronneby Department of Signal Processing, Sweden (1998).

Özbek, M.E., et al., "Musical Note and Instrument Classification with Likelihood-Frequency-Time Analysis and Support Vector Machines," *Proceedings of the 15th European Signal Processing Conference*, p. 941-945, EURASIP, Poland (2007).

Regalia, P. A., et al., "The Digital All-Pass Filter: A Versatile Signal Processing Building Block," *Proceedings of the IEEE* 76(1):19-37, Institute of Electrical and Electronics Engineers, United States (1988).

Sawada, H., et al., "Spectral Smoothing for Frequency-Domain Blind Source Seperation," *Proceedings of the International Workshop on Acoustic Echo and Noise Control*, p. 311-314, Japan (2003).

International Search Report and Written Opinion of the International Searching Authority directed to related International Patent Application No. PCT/US2009/064120, mailed Jan. 12, 2010, from the International Searching Authority; 8 pages.

International Search Report and Written Opinion of the International Searching Authority directed to related International Patent Application No. PCT/US2010/056333, mailed Jan. 21, 2011, from the International Searching Authority; 6 pages.

International Search Report and Written Opinion of the International Searching Authority directed to related International Patent Application No. PCT/US2010/056352, mailed Jan. 26, 2011, from the International Searching Authority; 9 pages.

International Preliminary Report on Patentability directed to realted International Patent Application No. PCT/US2010/056352, mailed May 24, 2012, from the International Searching Authority; 7 pages.

International Preliminary Report on Patentability directed to related International Patent Application No. PCT/US2010/056333, mailed May 24, 2012, from the International Searching Authority; 6 pages.

\* cited by examiner

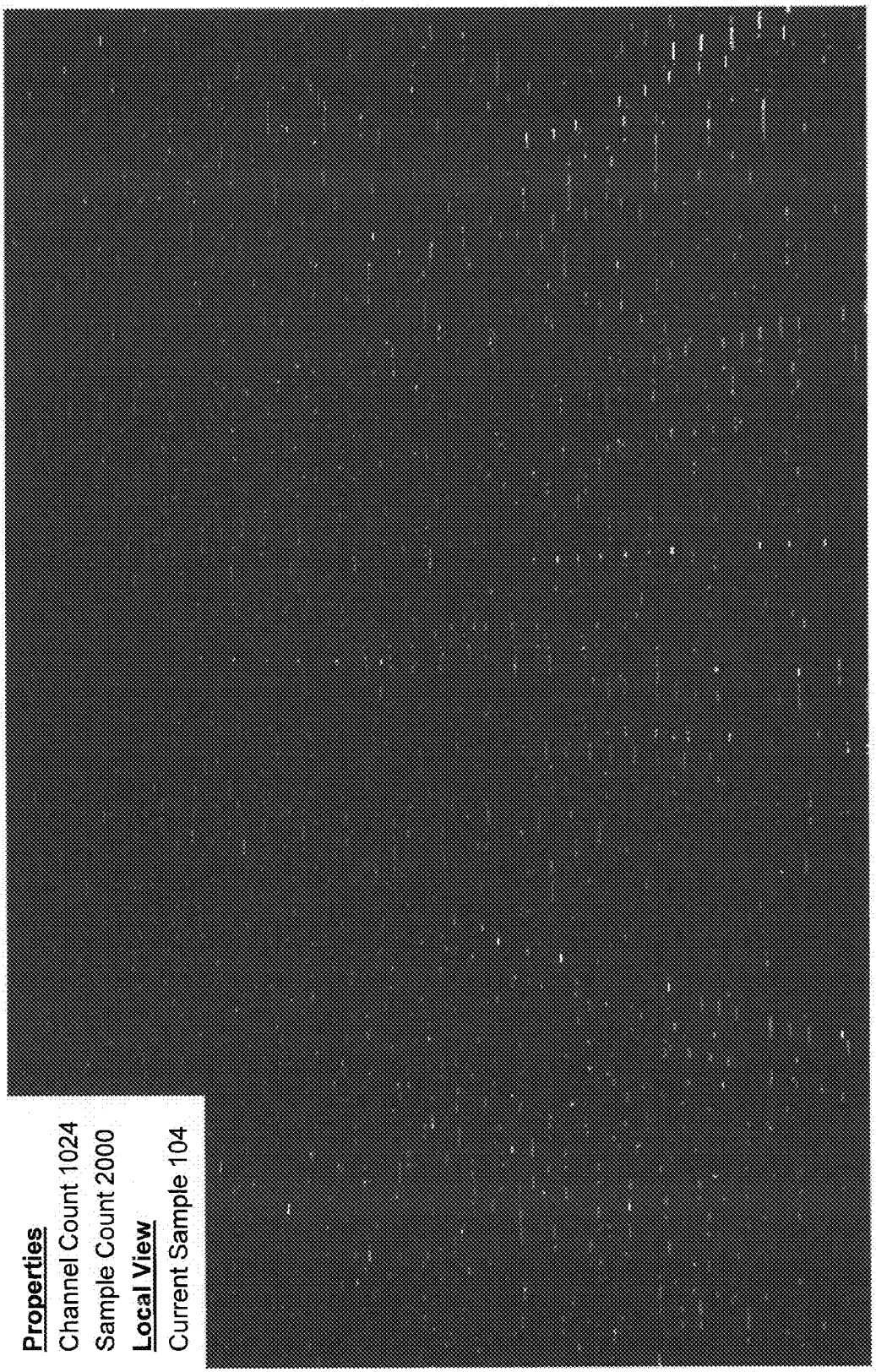

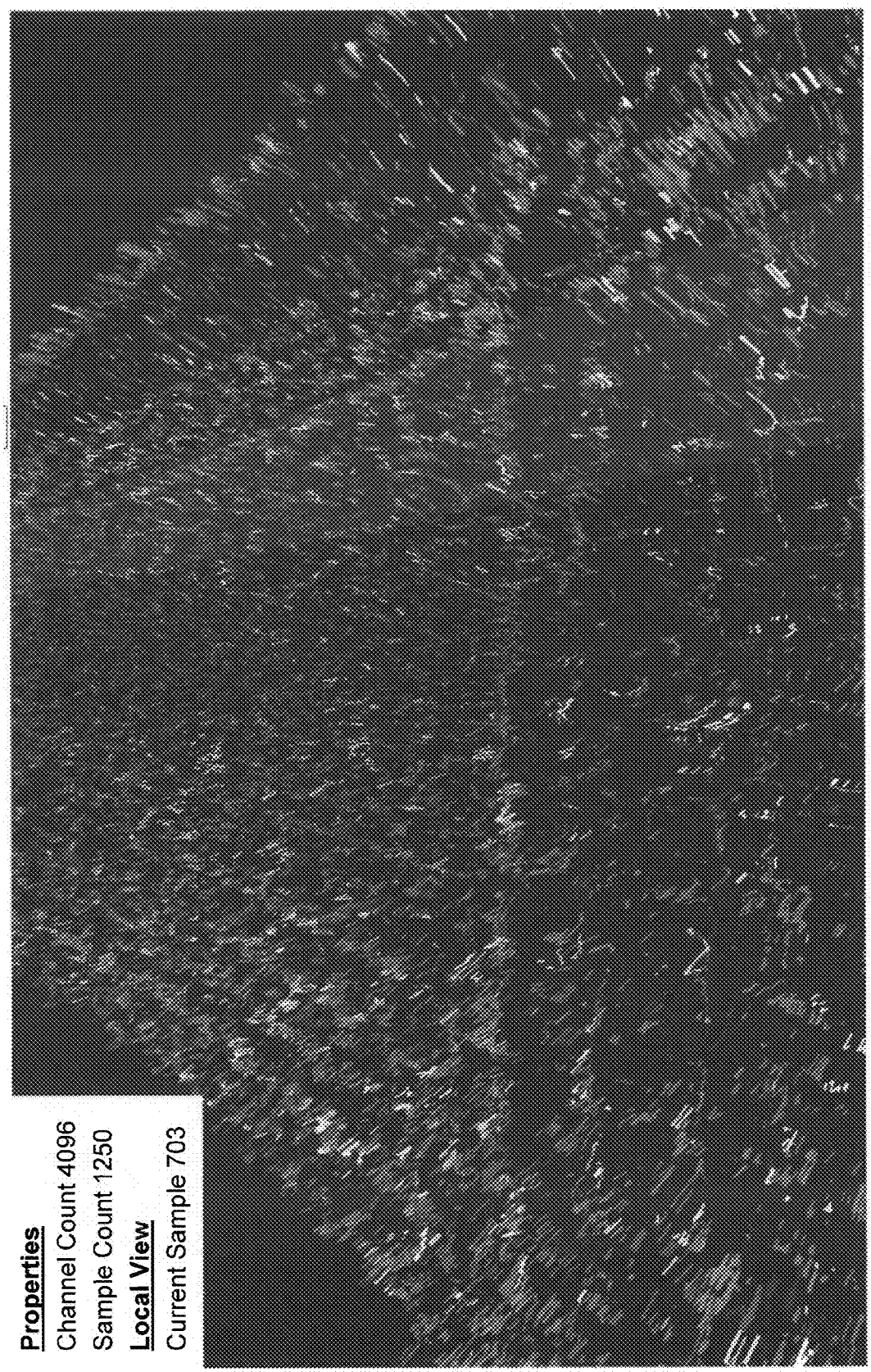

DOMAIN IDENTIFICATION AND SEPARATION FOR PRECISION MEASUREMENT OF WAVEFORMS

CROSS-REFERENCE TO RELATED APPLICATIONS

The present application claims the benefit of priority to U.S. application Ser. No. 61/379,092, filed Sep. 1, 2010, and PCT patent application No. PCT/US2009/064120 filed Nov. 12, 2009, the contents of which are incorporated herein by reference in their entirety.

FIELD OF THE INVENTION

The invention relates to the time-frequency-amplitude analysis, measurement and parsing apart of waveforms and compound waveforms. Note that the word "signal" is a popular synonym for the more general "waveform" and both may be used interchangeably here. A compound waveform consists of multiple waveforms (or signals) mixed together. While most of this document refers to the audio frequency range, a waveform for the purposes of this invention is not limited to any particular frequency range or complexity. Any technology which measures waveforms/signals as part of its process may be assisted by this machine and discovery process described.

BACKGROUND OF THE INVENTION

Given a compound waveform, it is desirable to accurately measure the waveform and its components, which may have been spawned by several sources. This is difficult when the waveform includes signals produced by different sources overlapping in time and frequency, low energy/amplitude signals eclipsed by higher energy/amplitude signals, rapid changes in frequency, and/or rapid changes in amplitude. If these waveforms could be more accurately measured, analyzed and the information parsed apart in different domains, it would greatly increase our ability to understand what these waveforms contain and how to separate and/or modify them.

Traditionally, waveforms are analyzed in the time and frequency domains. Typically, these waveforms are first captured digitally as amplitude samples in time, then a series of transforms are used to measure the signals and the result is displayed in a time, frequency and amplitude matrix. A variety of techniques have been developed to extract time/frequency/amplitude information from the time-series data. However, representing how the frequency and amplitude change with respect to time can be challenging, particularly when there are abrupt frequency and/or amplitude changes, or when signals from multiple sources occupy the same time and frequency regions.

One common transform for obtaining time, frequency, and amplitude information is the Discrete Fourier Transform (DFT). Unfortunately, there is a trade-off between frequency and time resolutions resulting from the size (dimension) of the DFT. The time window inspected by a DFT is proportional to its dimension. Thus, a large dimension DFT inspects a larger time window than a small dimension DFT. This larger time window makes a large dimension DFT slow to react to dynamic changes.

Conversely, a large dimension DFT slices up the frequency range into finer segments. The maximum frequency measured by the DFT is half the sampling rate of the digitized signal. A DFT of dimension X divides frequency range from 0 to the max into X/2 equal sized "bins." Thus, the size of each frequency bin in a DFT is equal to the sampling rate divided by its dimension.

So, higher dimension DFTs have higher frequency resolution but lower time resolution. Lower dimension DFTs have higher time resolution but lower frequency resolution. Because of this trade-off, practitioners have sought modified DFTs or other alternative methods to accurately represent dynamic, time-varying waveforms with good resolution in both time and frequency.

The inventors have been issued several patents, which are hereby incorporated by reference. They are: Fast Find Fundamental Method, U.S. Pat. No. 6,766,288 B1; Method of Modifying Harmonic Content of a Complex Waveform, U.S. Pat. No. 7,003,120 B1; and Method of Signal Shredding, U.S. Pat. No. 6,798,886 B1. Precision Measuring Matrix, PMM Patent Application No. PCT/US2009/064120 filed Nov. 12, 2009 is also hereby incorporated by reference.

SUMMARY

The invention provides a machine-implemented method for digital signal processing, comprising: obtaining a digital signal from conversion of an analog signal or from data storage; constructing Precision Measuring Matrice(s) (PMM(s)), as per Patent Application No. PCT/US2009/064120, comprised of cells containing the amplitudes for particular times and frequencies with marked correlated maxima; and identifying related cells using domain relationships of the maxima and partial chains of maxima in the PMMs in order to identify and separate sound sources within a complex compound waveform.

The extension claimed herein consists of new ways of identifying related cells in PMMs.

New ways of identifying related cells in PMMs, include following "domain" relationships: frequency, time, amplitude, harmonic, start time, stop time, peak time, length, attack and decay angles, repetition in frequency (non-harmonic), repetition in patterns, patterns found in memory and patterns not found in memory, and non random mathematical relationships. Specifically, maxima cells and/or chains of maxima cells that are related in one of these ways, or in multiple combinations of ways, are identified and flagged. Cells that are so related are of interest for source identification.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

Repeating events of 15 events every 10 seconds per frequency bin shown for the second audio sample.

Figure 6:
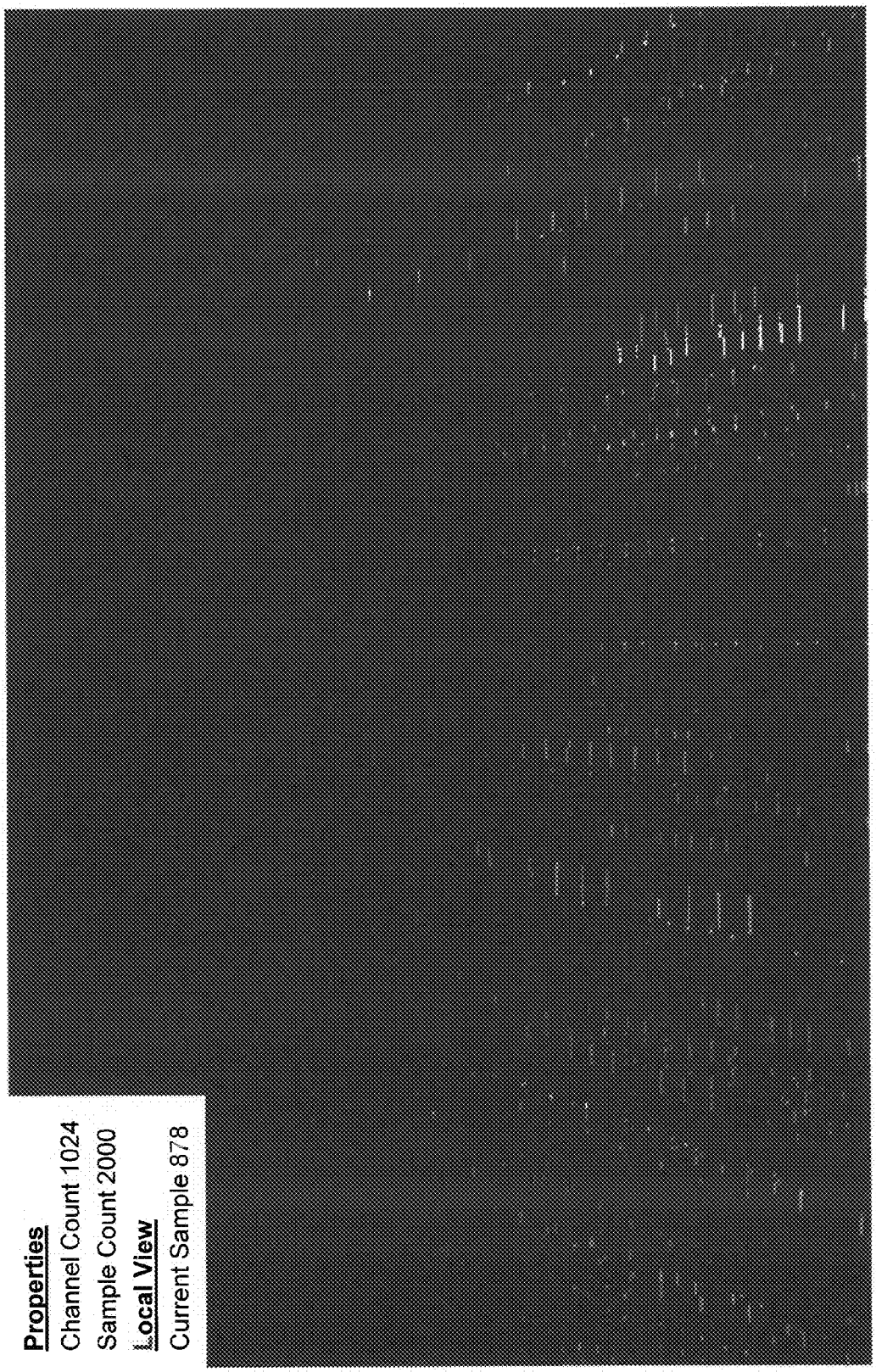

FIG. 6 is a two-dimensional screen shot of Combination Domain of Harmonic and Amplitude Domains for the second audio sample.

Figure 7:
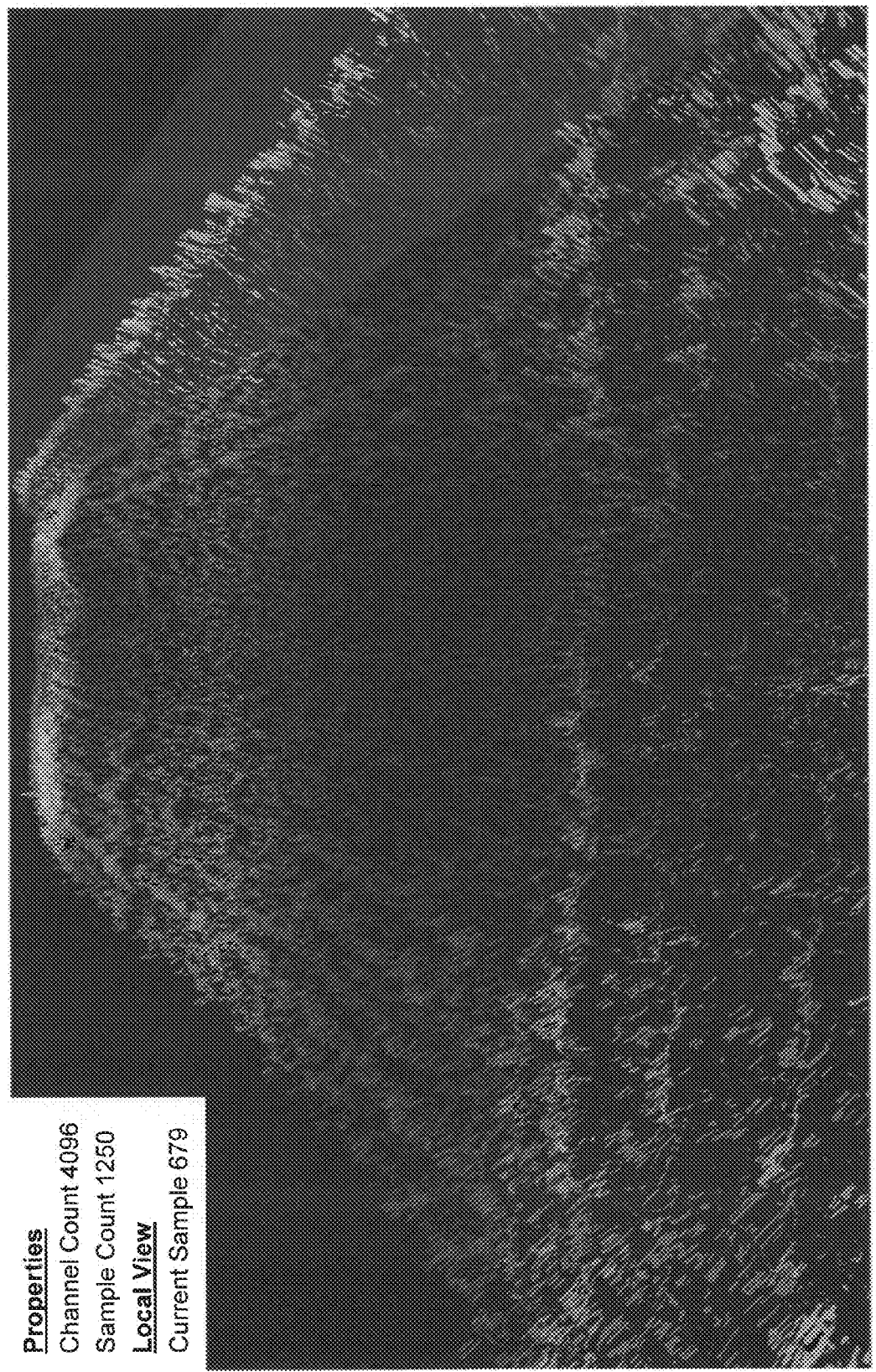

FIG. 7 is a visualizer three-dimensional screen shot for a third audio sample signal, showing all PMM events.

Figure 8:
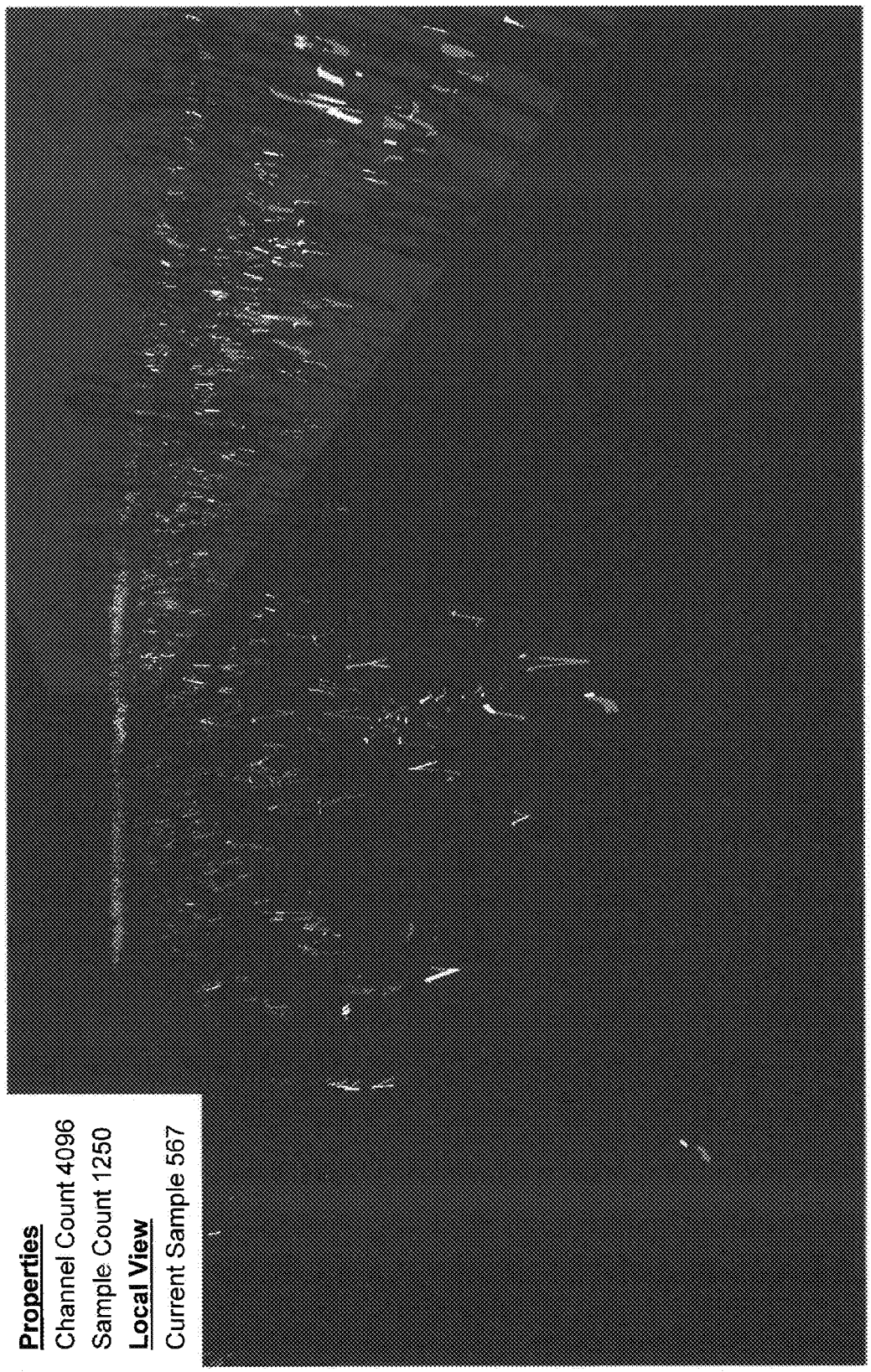

FIG. 8 is a three-dimensional screen shot of Amplitude Domain events shown occurred within a defined amplitude range for the third audio sample.

Figure 9B:
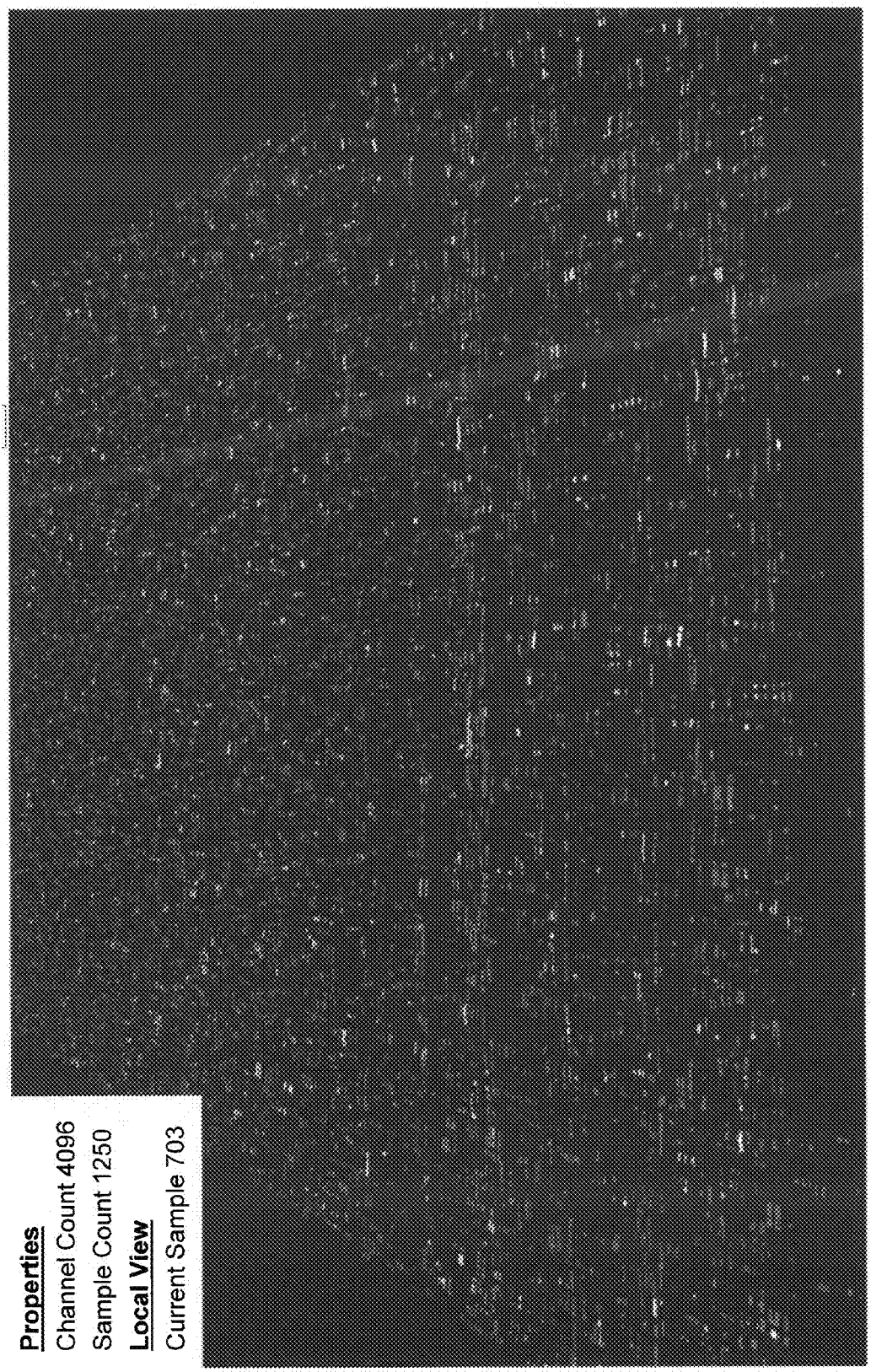

FIGS. 9A and B are three-dimensional and two-dimensional screen shots respectively of Partial Chain Domain sorted by start time for the third audio sample.

Figure 10:
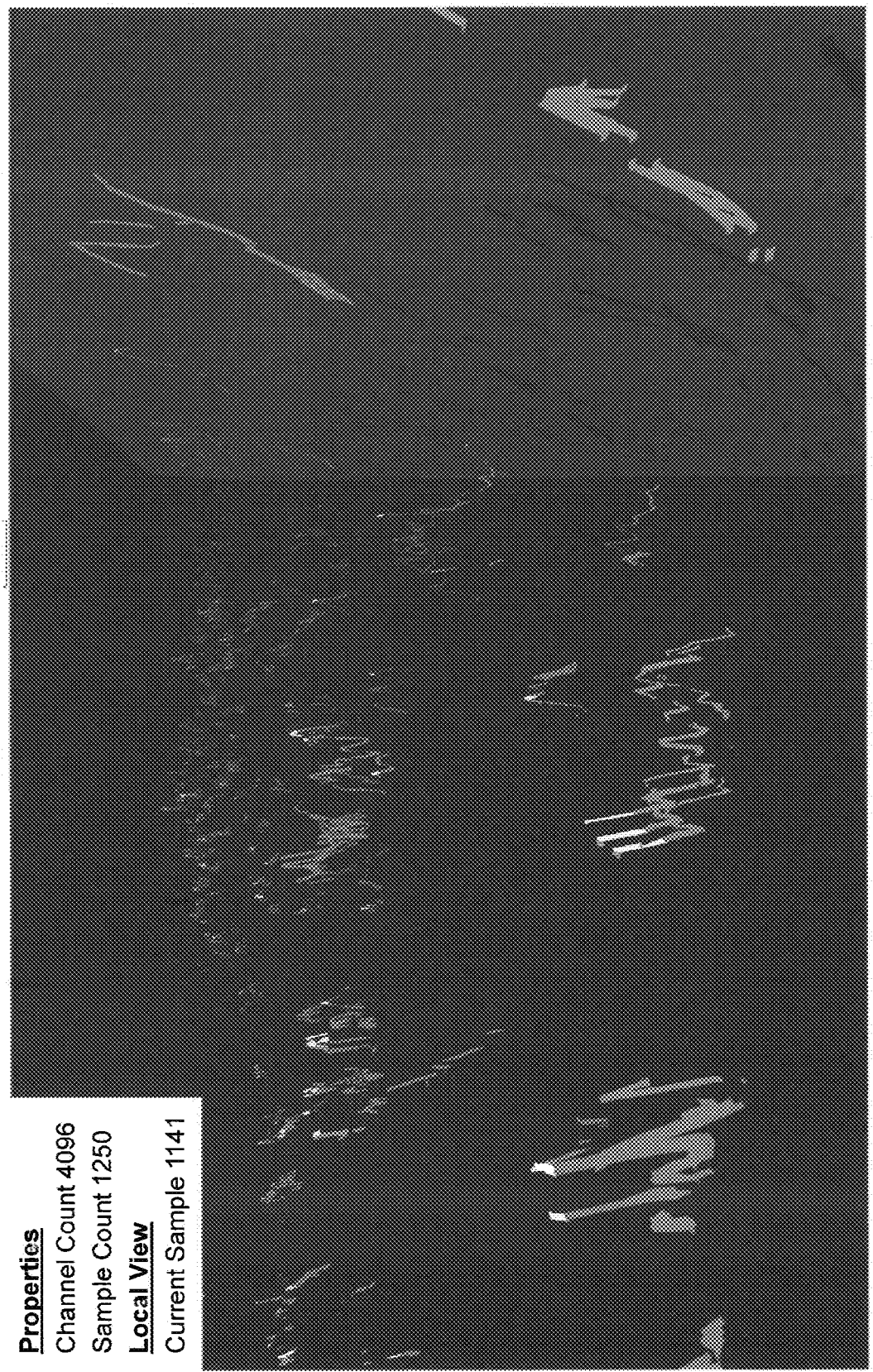

FIG. 10 is a Partial Chain Domain screen shot—long chains (over 0.375 seconds) for the third audio sample.

Figure 11:
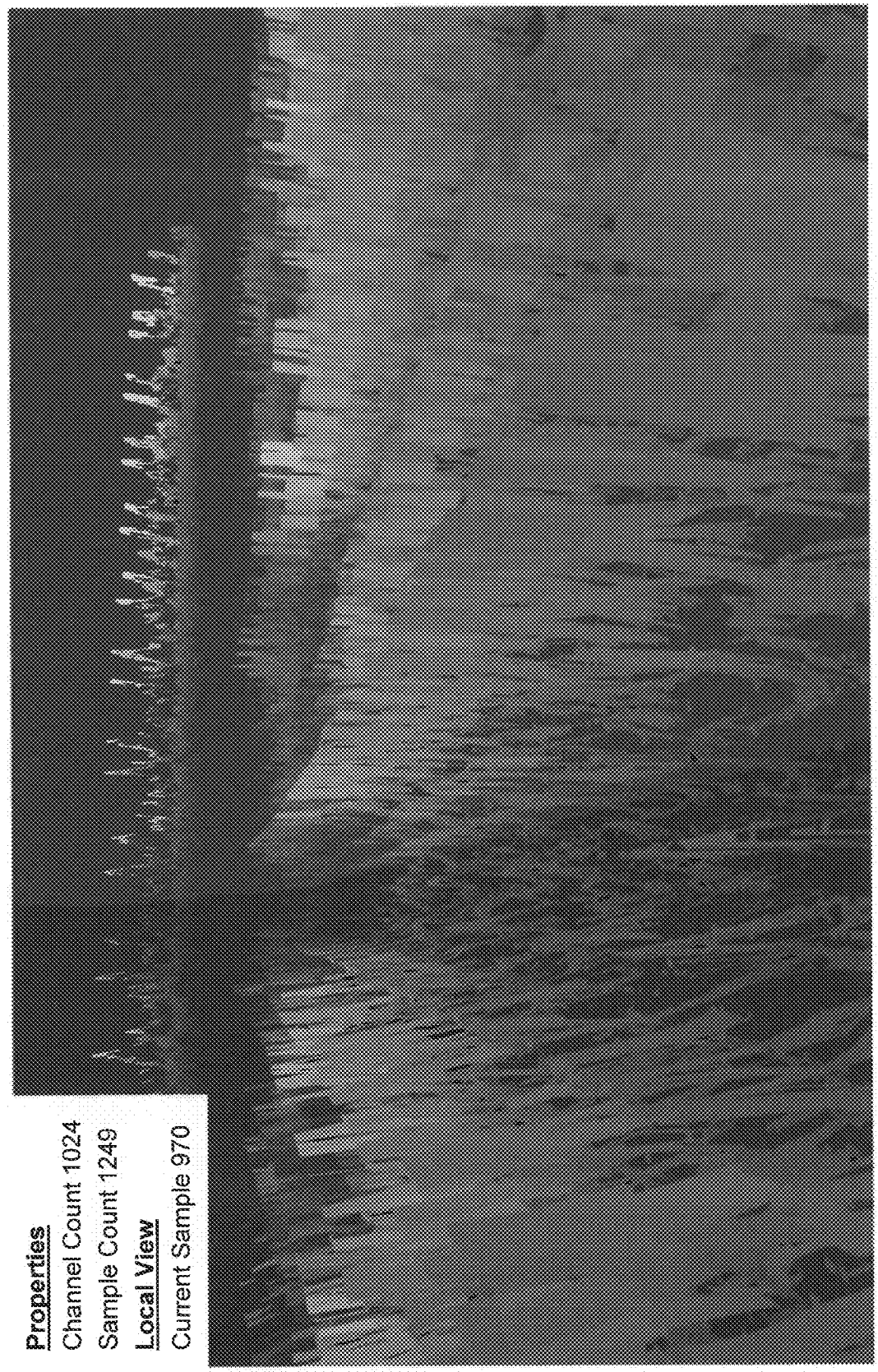

FIG. 11 is a Partial Chain Domain screen shot—showing angle parameter for a fourth audio sample.

Figure 12:
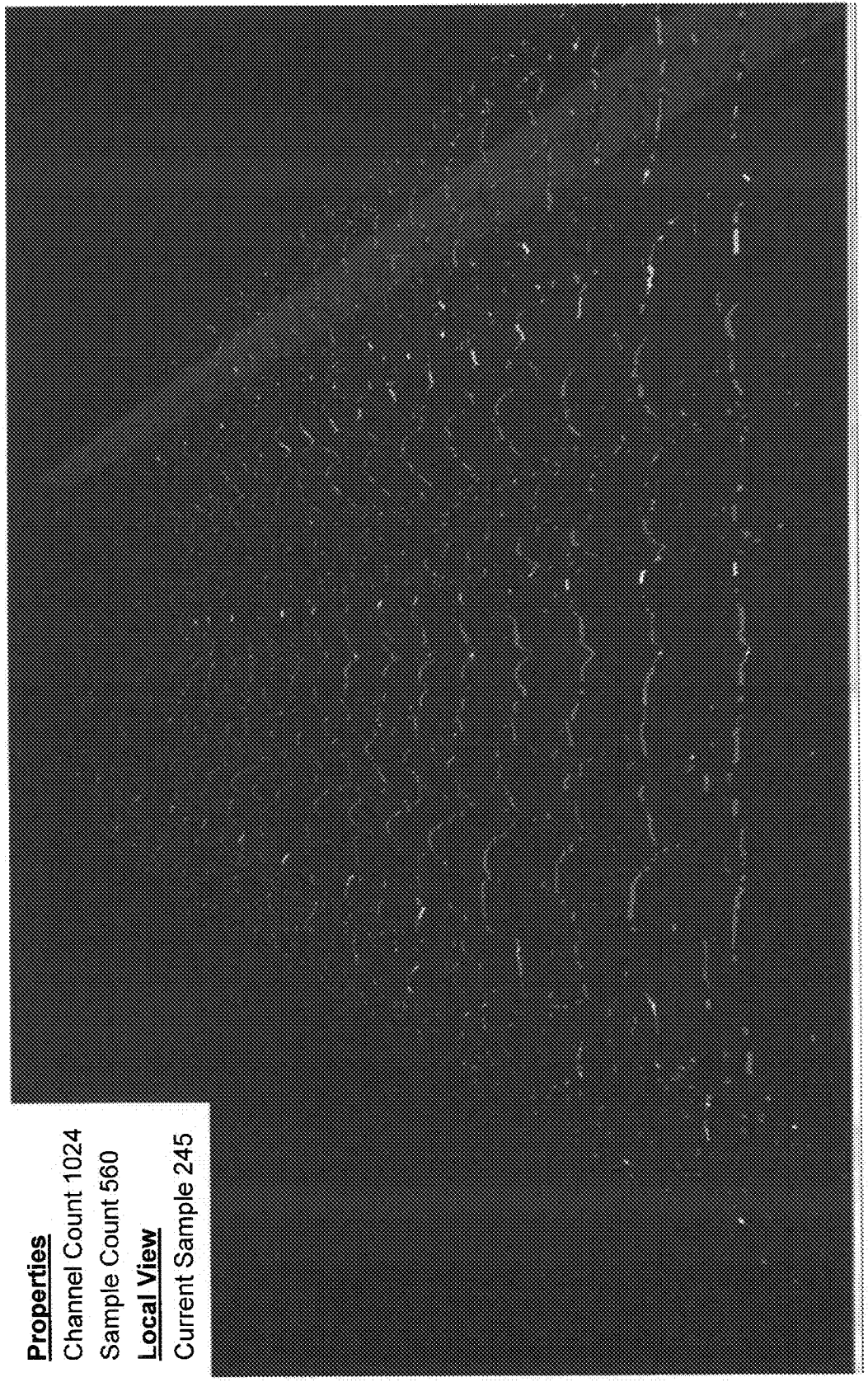

FIG. 12 is a three-dimensional screen shot of Harmonic Domain events shown are harmonically related for a fifth audio sample.

Figure 13:
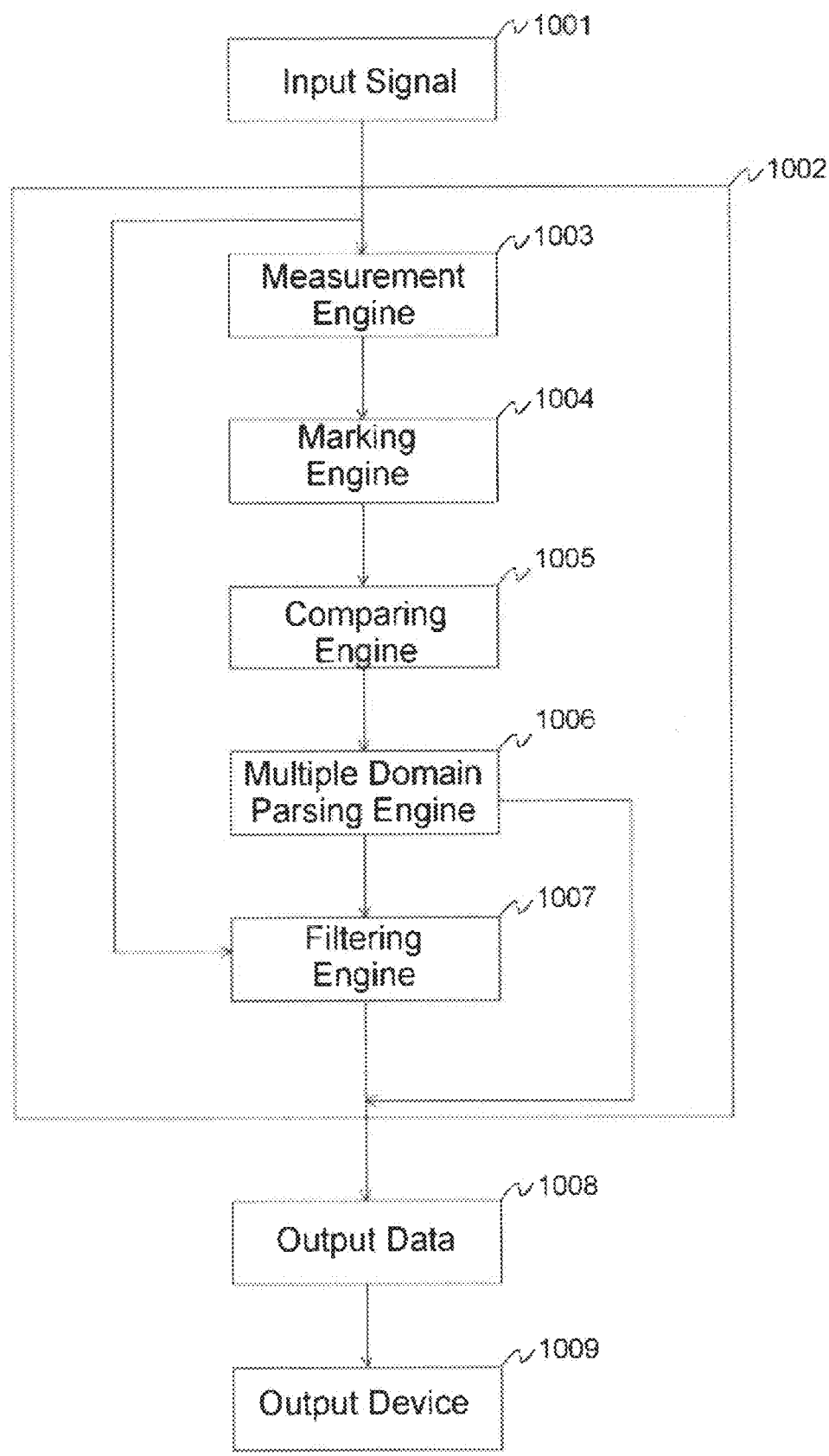

FIG. 13 is an alternative illustrative diagram for explaining the utility of the disclosed embodiments.

DETAILED DESCRIPTION OF THE INVENTION

As explained above, disclosed embodiments provide new ways of identifying related cells in Precision Measuring Matrices (PMMs) constructed based on an obtained digital signal. As explained in Application No. PCT/US2009/064120, PMMs are comprised of cells containing the amplitudes for particular times and frequencies with marked correlated maxima. Identifying related cells using domain relationships of the maxima and partial chains of maxima in the PMMs enables one to identify and separate sound sources within a complex compound waveform. Thus, new ways of identifying related cells in PMMs have significant utility and practical applications.

Preliminary to an in depth discussion of the disclosed embodiments, it should be understood that, broadly speaking, PMMs are constructed by performing a plurality of DFTs (or their equivalent) to generate Measuring Matrices (MMs), which are matrices of cells representing the spectral amplitude of a digital signal to be analyzed. Thus, each DFT creates, for a particular time slice, a row or column of cells (one cell for each frequency bin).

A PMM is a matrix of time, frequency and amplitude events generated from the MM with correlated maxima marked as described in Patent Application No. PCT/US2009/064120. It should be appreciated that, where necessary, the generated MMs may be stretched to provide overlap to ensure that there is appropriate coverage throughout the PMM as explained that patent application.

In accordance with the present disclosure, new ways of relating cells in PMMs are provided; more specifically, cells can be related by the following "domain" relationships: frequency, time, amplitude, harmonic, start time, stop time, peak time, length, attack and decay angles, repetition in frequency, repetition in patterns, patterns found in memory and patterns not found in memory, and non-random mathematical relationships. Thus, maxima cells and/or chains of maxima cells that are related in one of these ways, or in multiple combinations of ways, may be identified and flagged. As a result, cells that are so related may be identified as candidates for source identification.

With this preliminary and generalized explanation of the disclosed embodiments in mind, the following provides more specific definitions of various terms used in the followed detailed description.

Definitions

The following definitions are used herein.

FT: Fourier Transform—an algorithm that computes the amplitudes of the spectrum for a waveform.

DFT: Discrete Fourier Transform—an algorithm that computes the amplitudes of the spectrum for a discrete (digitized) waveform. The DFT output can be a complex number or just the real amplitude. Many of the preferred embodiments of this invention only need the real amplitude. Unless specifically described as complex, all references to DFTs herein are for DFTs with real output.

FFT: Fast Fourier Transform—a fast running DFT method that is so popular that its name is often used synonymously with DFT. DFT and FFT are used interchangeably herein.

Window: The portion of time used by a Fourier Transform (or equivalent technique). In a DFT the window size (in samples) is known as the dimension of the DFT. For example, if a signal is digitized with 8000 samples per second, a DFT with a dimension of 4000 will operate on 4000 samples (one half-second) of data.

Windowing technique: A popular DFT method whereby the samples within the window are not all treated equally. For example, a simple DFT with dimension 4000 will simply transform the 4000 samples. With a windowing technique, the 4000 samples will be modulated to give more weight to the samples in the middle and less weight to the samples at the beginning and the end. Windowing techniques are designed to reduce the side lobes/artifacts in the DFT's frequency response.

dB: decibel—logarithmic ratio of measurement used in, for example, acoustics and electronics measurements and calculations specifically used for the amplitudes or energy cells.

dBFS: dB Full Scale—DB relative to the maximum peak level in the digital representation.

Time slice: A portion of time. A time slice may, for example, be represented by an FFT run on a particular time window of data. However, the window will typically be much larger than the time slice it represents and centered on the time slice. The size of the time slices is determined by the spacing between successive FFT runs, not by the size of the window. For a digitized signal with 8000 samples per second, if a new FFT is run every 8 samples, then the time slices are 8 samples (1 millisecond) wide. The FFT window might be 4000 samples (a half-second or 500 time slices) wide.

Frequency bin: A small range of frequencies (e.g. 1702-1704 Hz)

Cell: A unit in a matrix. Typically, a cell represents a frequency bin in a time slice and contains an amplitude in dBFS. Note that having cells does not limit frequency or time resolution. The range of frequencies covered in a bin could be, for example, 0.001 Hz. Similarly, a time slice could be less than 0.001 seconds.

MM: Measuring matrix—A matrix of cells representing the spectral amplitude of a waveform over time. A measuring matrix is generated by repeated FFTs (or the equivalent). Each FFT creates, for its time slice, a row (or column) of cells—one cell for each frequency bin. The amplitude in each cell is the amplitude for that frequency bin in that time slice. The cells are then inspected and marked, as appropriate, as maxima. A measuring matrix can be of infinite length, when processing a continuous signal in near real time. For a limited time waveform, a measuring matrix can be of finite length.

Maximum Cell: A cell marked as having one or more types of maxima.

Simple Maximum Cell: A cell whose amplitude is greater than the cells immediately adjacent. If a cell's amplitude is greater than that of the cells in the same time slice that are just above it and just below it in frequency, the cell is a frequency peak simple maximum. If a cell's amplitude is greater than that of the cells in the same frequency bin that are just before it and just after it in time, the cell is a time peak simple maximum. A single cell can be both a time and frequency simple maximum. Time peak and frequency peak simple maximum cells may be distinctly marked or may be treated as synonymous and just called "simple maximum cells," or, "simple maxima," for short.

Associated Maximum ("little brother") cell: A cell adjacent to a simple maximum whose amplitude is within a designated threshold of the simple maximum's and also greater than that of the cell on the other side. If a cell is a frequency peak simple maximum, the cells in the same time slice that are just above and below the simple maximum in frequency are candidates for associated maxima. If a cell is a time peak simple maximum, the cells in the same frequency bin that immediately precede it and succeed it are candidates for associated maxima. In a disclosed embodiment, if the amplitude in the candidate cell preceding a time peak simple maximum is within 2 dB of the simple maximum's amplitude and also greater than the amplitude of the cell that precedes it, then it would be marked as a little brother. In a disclosed embodiment, if the amplitude in the candidate cell just above the frequency peak simple maximum in frequency is within 3 dB of the simple maximum's amplitude and also greater than the amplitude of the cell just above it in frequency, then it would be marked as a little brother. The dB thresholds for little brothers adjacent in time need not be the same as for little brothers adjacent in frequency. Time and frequency little brothers may be distinctly marked or may be treated as synonymous and marked simply as little brothers. A single cell can be both.

Angle Maximum Cell: A cell where the difference in amplitude between it and the adjacent cells on opposite sides changes more than a given threshold. In a disclosed embodiment, if a cell is 4 dB greater than the cell, in the same frequency bin, that immediately precedes it in time but is only 1 dB less than the cell that succeeds it, the 3 dB difference qualifies it as an angle maximum (specifically, a time angle maximum). Frequency angle maximum are found analogously by comparing a cell's amplitude with that of the cells, in the same time slice, just above and below it in frequency. Angle maxima may be distinctly marked as frequency angle maxima and/or time angle maxima or may be treated as synonymous and marked simply as angle maxima. A single cell can be both.

Burglar Maximum Cell: A maximum cell where the maximum is detected by measuring amplitude changes as a signal peak enters and exits a DFT window. An energy peak within a frequency bin will affect the amplitude of all cells in that bin where the peak is within the cell's transform window. If the transform window is, for example, 500 time slices wide, then the peak will enter the window 500 time slices (cells) before it exits. By comparing the increase in amplitude to the decrease 500 time slices later, and also comparing them both to a specified threshold, a burglar maximum may be declared. The cell(s) in the middle are then marked. If the peak is longer than one time slice in duration, the energy will ramp up over a number of cells (time slices or rows) and ramp back down similarly 500 cells later, and multiple cells in the middle will be marked as burglar maxima. Thus, unlike the other types of maxima, a burglar maximum is not detected by comparing a cell with its immediate neighbors. Since the window can be much wider than a single time slice, the amplitude changes may be seen in cells far removed from the cell(s) to be marked. Also, unlike the simple, associated and angle maxima, a burglar maximum can only exist as a time maximum; there is no analogous frequency maximum.

Partial: A marked maximum cell (e.g. a simple maximum little brother).

Partial Chain: A collection or chain of partials linked together (by proximity). A partial chain may include one or more partials per time slice. A partial chain may traverse the time slices as a straight line, a curved line and/or an angled line. Partial chains are considered to be linked cells. Partial chains are also known as "chains" or "events". Note: a partial chain is a chain of partials—not an incomplete chain.

Chain: Synonymous with a partial chain.

Event: A collection of partials linked together—synonymous with a partial chain.

PMM: Precision Measuring Matrix—A matrix of time, frequency and amplitude events from the MM with correlated maxima marked as described in Patent Application No. PCT/US2009/064120.

Visualization Module: The PMM shown in a three-dimensional visualization module.

Domain: A category for parsing events.

Frequency Domain: (Commonly Known) The frequency at which "events" occurred. Identification or separation of events based on frequency.

Time Domain: (Commonly Known) The time at which "events" occurred. Identification or separation of events based on time.

Amplitude Domain: The domain in which "events" are identified based on amplitude.

Harmonic Domain: Events that are harmonically related. Identification and/or separation of events based on common harmonically related partial chain frequencies. Reasonably simultaneous events can have separate frequency events that are harmonically related.

Repeating Domain: Events which repeat over time. Identification or separation of events based on repeating chain events per frequencies. Events at different times can be related by the spacing between them and their repeating occurrences in time.

Partial Chain Domain: Events which are similar in simple ways. Identification or separation of events based on coherent start time, coherent stop time, coherent peaks in time, angle of chain attack/decay, and/or length of chain.

Memory Domain: Events that are of interest because of their shape and how that shape compares to shapes stored in memory. An event may be of interest because its shape matches a preconceived shape already stored in memory. Also, an event may be of interest because its shape does not match a known shape in memory. Note: matching a preconceived shape may be approximate or may simply involve matching a shape criterion (e.g., any event in the shape of a spiral may be of interest—or just any right hand spiral).

Non-Random Domain: Events that can be identified as not random. Partial chains with mathematical relationships not defined in other domains.

Combination of Domains: The operator can combine and adjust parameters relating to each domain to separate signal events.

Signal discovery may not be limited to the domains listed above.

Preliminary to the more detailed description of embodiments of this disclosure, a summary review of supporting technology provided in previously filed Application No. PCT/US2009/064120 (incorporated by reference) is provided to fully disclose the context of the embodiments. In accordance with the embodiments of that previously filed disclosure, a machine-implemented method for digital signal processing is provided. That method includes obtaining a digital signal from conversion of an analog signal or from data storage, constructing one or more MMs comprised of cells containing the amplitudes for particular times and frequencies, marking maxima in these matrices based on comparisons of the cell amplitudes, and relating those maxima to find correlated maxima, where multiple maxima agree in both time and frequency. Thus, a novel matrix, called a PMM, is generated with the correlated maxima marked. (Note: all these maxima may be local maxima but, for brevity, are referred to simply as "maxima.")

Each MM may be generated by repeated transformation of the input signal using, for example, an FFT. Each transformation represents a portion of time, called a time slice, in the input signal and has a row of cells, each cell corresponding to a frequency range, called a frequency bin. Each cell is populated with an amplitude, representing the signal strength for its corresponding frequency bin/time slice. Cells in each MM having maximum amplitudes along, preferably, each time slice (and/or frequency bin) may be identified and marked.

Various methods for identifying maxima may be used, yielding many types of maxima. Maxima in various matrices and/or of various types that coincide in time and frequency may be marked in the PMM. Adjacent correlated maxima in the PMM may then be linked together via proximity as partial chains.

A maximum cell may be identified by comparing its amplitude with the amplitudes of adjacent cells or by comparing the amplitudes of other specifically related cells. A cell may be a simple maximum cell if the amplitude of the cell is greater than the amplitudes of its adjacent cells. Other types of maxima include: associated "little brother" maxima, angle maxima, and burglar maxima. If multiple maxima are found, for the same time slice and frequency bin (usually in different MMs), then the maxima coincide, and the corresponding cell in the PMM may be marked as a correlated maximum. The amplitude in each cell in the PMM is populated with a function of the values in the corresponding cells in the originating MMs (e.g., a weighted average).

In accordance with Application No. PCT/US2009/064120, high resolution and accuracy measurements of instantaneous frequency and amplitude of a time series signal may be made. This may be accomplished by constructing multiple MMs of varying sizes, marking the maxima in the MMs, and then correlating the maxima. Smaller-dimension transforms provide better time resolution while the larger-dimension transforms provide better frequency resolution. For this reason, two or more measuring matrices (differing, for example, in time and frequency resolutions) are used to build the PMM. Adjacent maxima in the PMM can be linked into chains called partial chains. This linking is accomplished by connecting any two maximum cells in adjacent time slices that are in identical or close frequency bins.

In one disclosed embodiment of Application No. PCT/US2009/064120, two MMs may be created using FFTs of different dimensions and simple maxima and little brothers (in both time and frequency) may be marked with a 2 dB threshold for the little brothers. In that embodiment, all four types of maxima (i.e., time or frequency, and simple or little brother) may all be marked simply as "maxima." The PMM is created by comparing cells in the two MMs with matching time and frequency and marking maxima in the PMM where both have maxima. The cells in the PMM are populated with the average amplitude of the corresponding cells in the original MMs.

Other embodiments of the inventive concept of Application No. PCT/US2009/064120 may be produced by variations on this one. Thus, the time maxima could be dropped and only frequency maxima used. The little brother threshold could be changed from 2 dB to any other value or the little brothers could be eliminated. More than two MMs could be created and correlated. When more than two MMs are used, the agreement between all of them need not be universal. For example, if five different measuring matrices are used, three out of five maxima at the same time and frequency might be required to identify a correlated maximum.

Also, instead of simply treating all maxima equally or of equal weight, a little brother may be treated differently from a simple maximum. The criteria for a correlated maximum may be more complicated than simple counting or addition—any mathematical formula is possible.

Also, a correlated maximum may be determined differently for different frequency ranges. For low frequencies, larger dimension measuring matrices may be needed for the increased frequency resolution. Conversely, for high frequencies, smaller dimension measuring matrices may work fine.

Any combination of these variations may be used. Also, any windowing technique might be used. Multiple MMs can be generated using the same dimension FFT but different windowing techniques. Maxima may then be marked in these MMs (possibly with different marking criteria), and then the MMs may be compared to find correlated maxima and build the PMM. Alternatively, multiple MMs may be produced, using both different dimensions and different windowing techniques. Hence, the possible combinations are endless.

With this understanding of the technological innovations provided in Application No. PCT/US2009/064120 in mind, the presently disclosed embodiments will now be described. Specifically, presently disclosed embodiments provide New ways of identifying related cells in PMMs (created, for example, in accordance with the disclosed methodologies of Application No. PCT/US2009/064120). Such related cells in PMMs may be identified in order to identify and separate sound sources within a complex compound waveform. Each PMM consists of cells, each cell representing a frequency bin within a particular time slice. Each cell may contain an amplitude value which may represent the signal strength at that frequency (the frequency range encompassed by the bin) at that time (the range of time encompassed by the time slice.) Thus, some cells may be marked as peaks, meaning they contain greater amplitude than adjacent cells. Cells marked as peaks may be generally considered to represent significant signals while other cells may typically not marked and may be background noise. Marked cells that are adjacent (or nearly adjacent, e.g., differing in location by a predetermined or acceptable number of positions) in frequency and time may then be linked together into partial chains.

Thus, in accordance with the presently disclosed embodiments, new ways of relating cells, partial chains and/or events in PMMs can relate them by: amplitude, harmonic relationships, repetition, start time, stop time, peak time, length, attack and delay angles, patterns in memory, patterns not in memory, frequency and/or time, non-random occurring patterns. Specifically, groups and/or chains of cells that are related in one of these ways, or in combinations of ways, may be identified and flagged.

Figure 1:
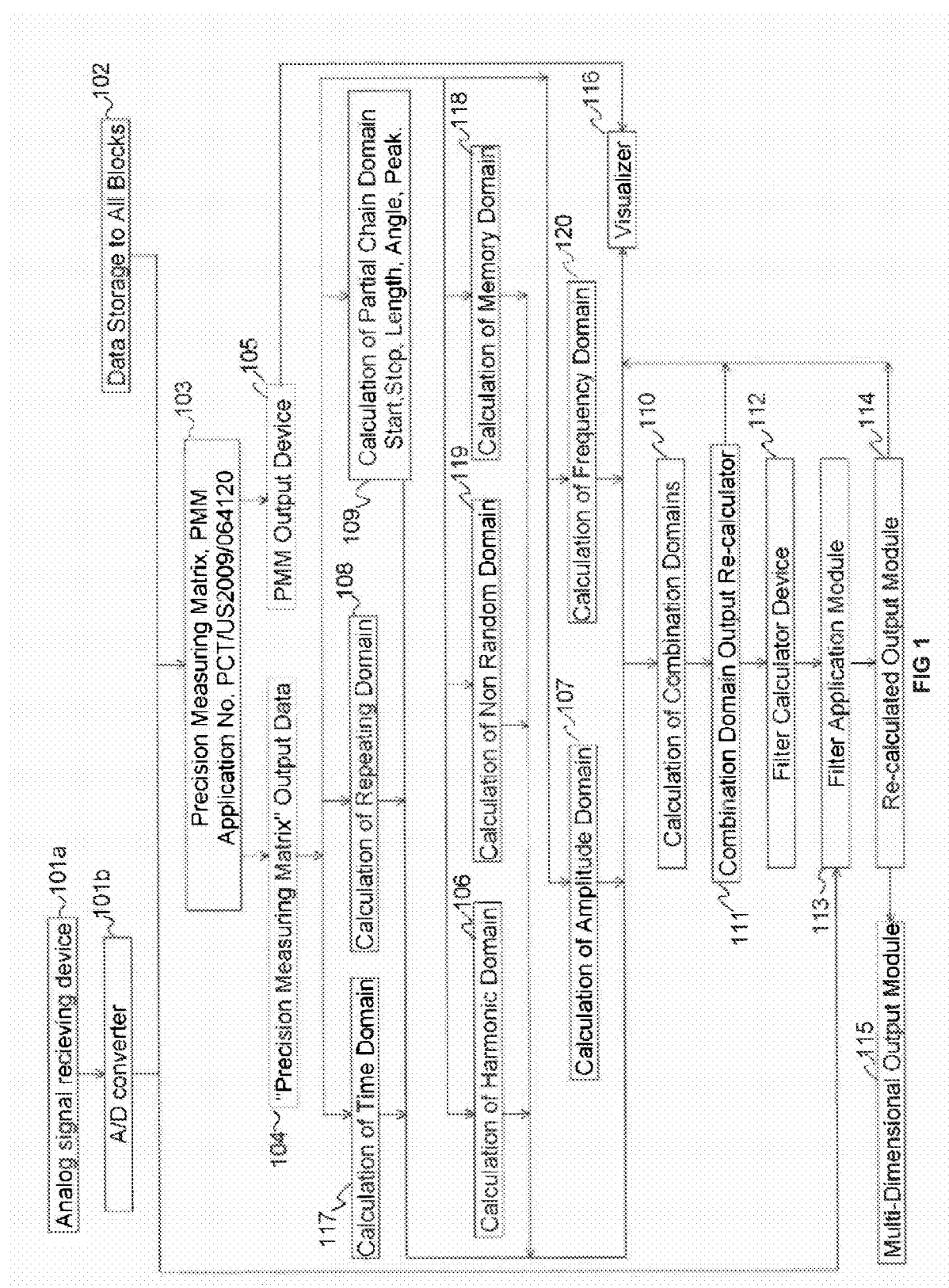
FIG. 1 is a block diagram illustrating the function of various disclosed embodiments.

In FIGS. 2-12, which are screen shots for the visualization module 116 illustrated in FIG. 1, the time axis is left to right; the frequency axis is front to back and is colored low frequency to high frequency. It should be appreciated that, if a computer monitor displaying such screen shots were a color monitor, low frequency may be, for example, indicated by purple, whereas high frequency may indicated, for example, by red. Amplitude may be denoted by height and color may be shown lighter as amplitude increases.

Figure 2:
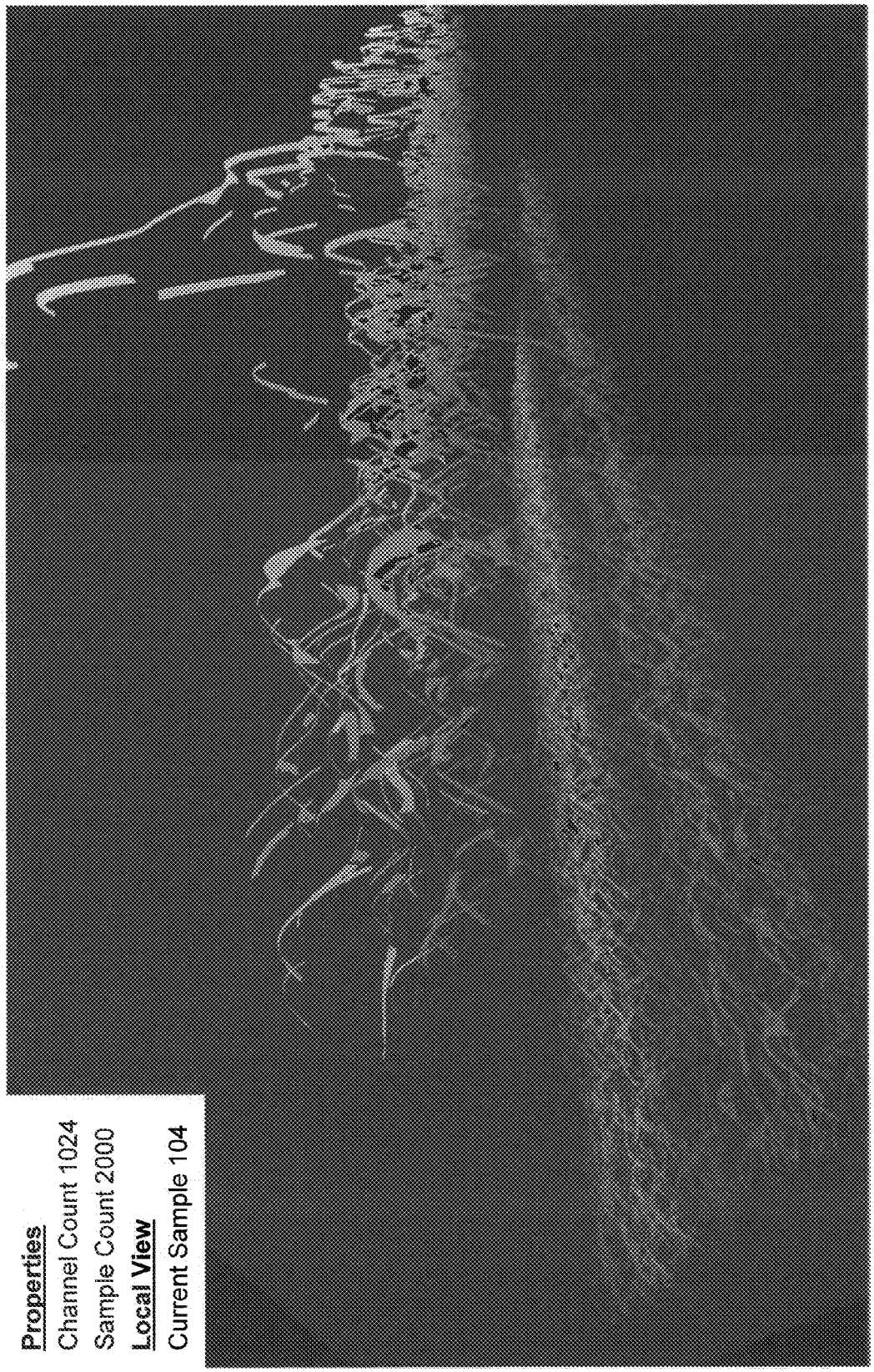
FIG. 2 is a visualizer three-dimensional screen shot for an audio sample signal, showing all PMM events.

A three-dimensional screen shot for a first and a second audio sample signal, showing all PMM events, is shown in FIGS. 2 and 7 respectively.

Figure 3:
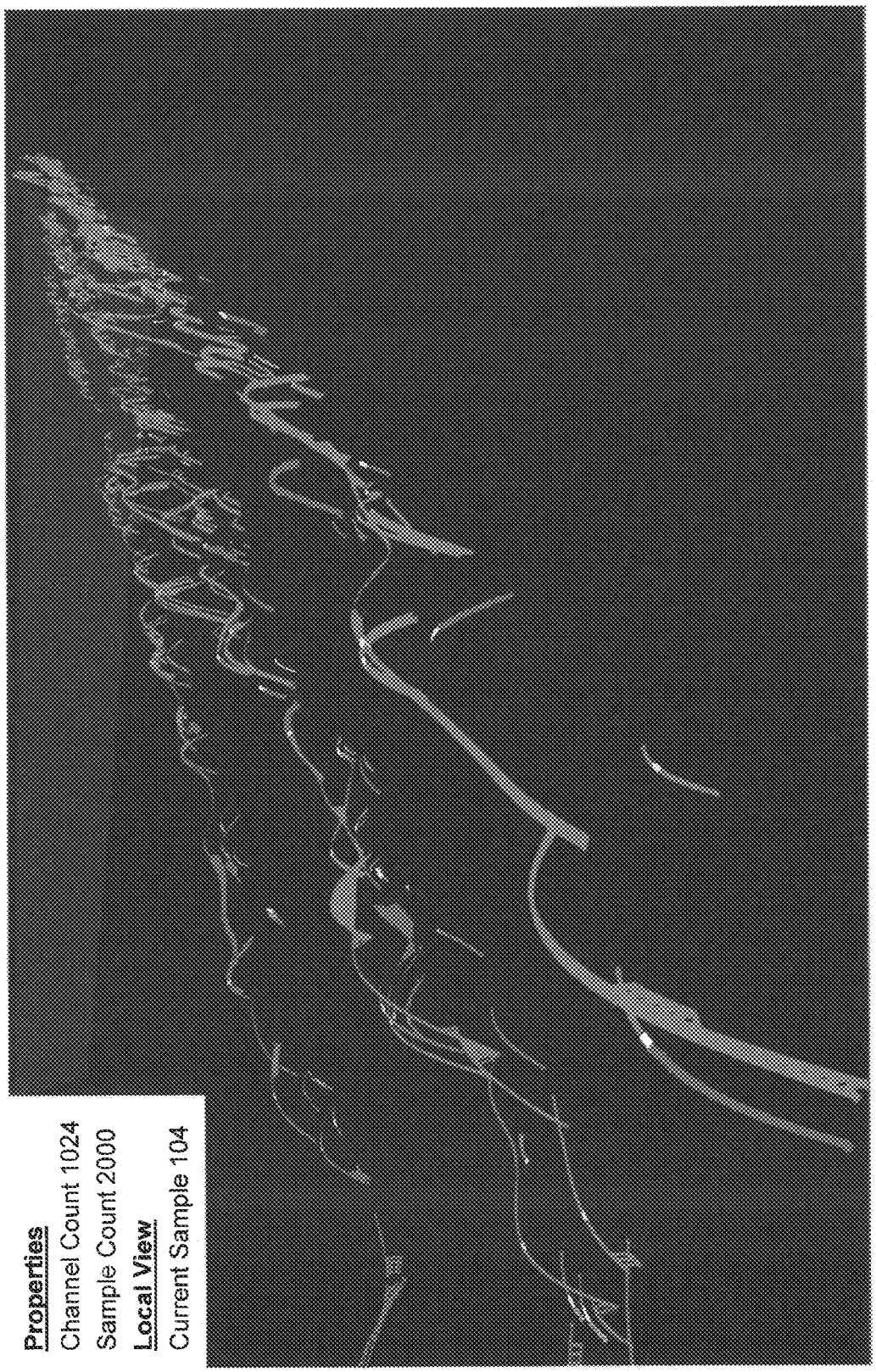
FIG. 3 is a three-dimensional screen shot of parsed Amplitude Domain events shown occurring above a defined amplitude level for the sample.

In accordance with a disclosed embodiment, a source may be sought whose amplitude is such that its partial chains would be in the −70 DBFS to −80 DBFS range. Thus, only cells (or chains) in the −80 to −90 DBFS range may be identified for consideration. A chain which is partly in that range but wanders out of that range at times may still be accepted and considered. An example of screen shots of the amplitude domain in the range of 0 dB to −60 dB for a sample is shown in FIG. 3 and for the range of −85 dB to −95 dB for another sample is shown in FIG. 8.

Figure 4A:
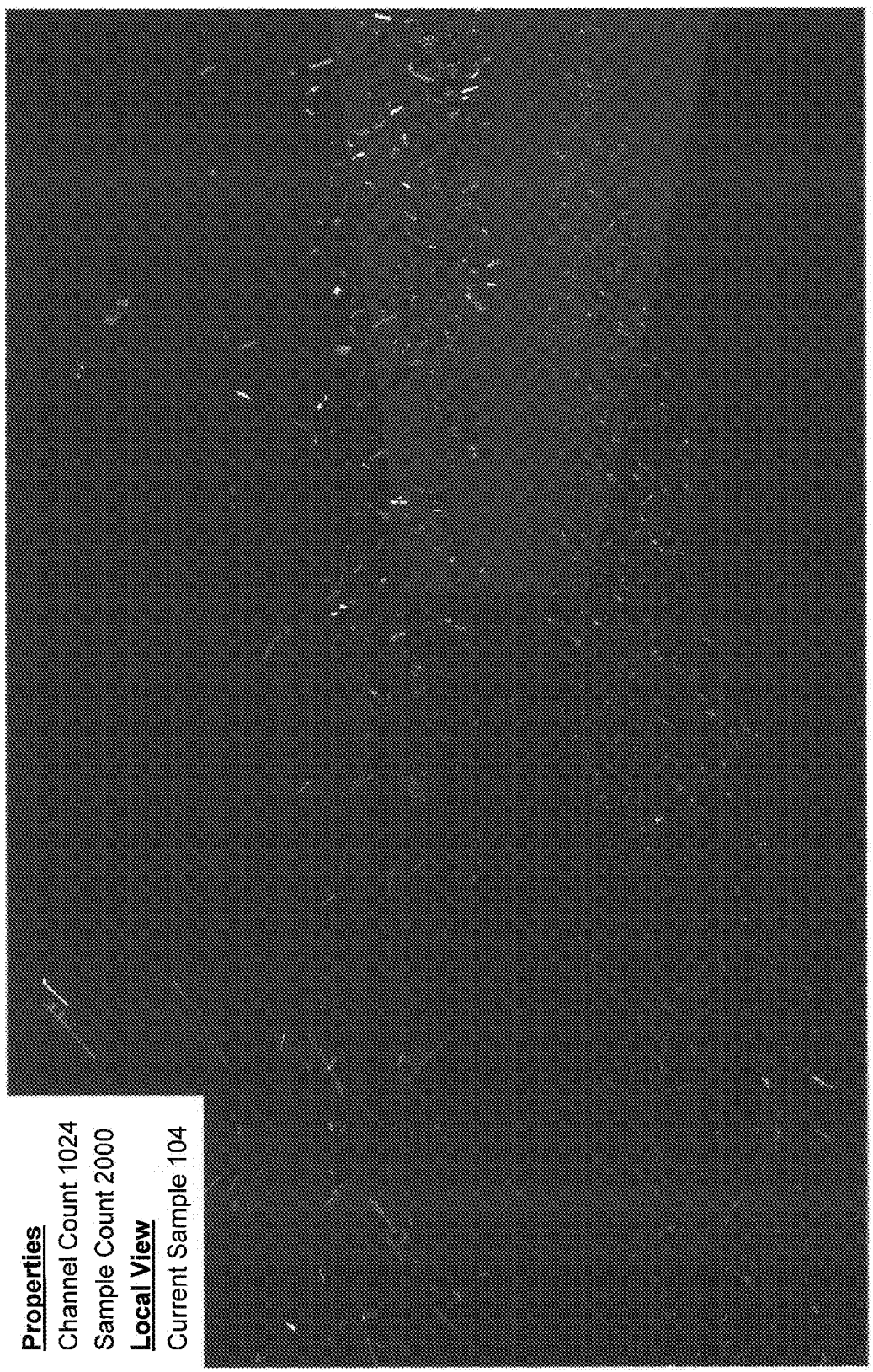
FIGS. 4A and B are three-dimensional and two-dimensional screen shots respectively of Harmonic Domain events shown are harmonically related for the sample audio signal, as per Fast Find Fundamental Method, U.S. Pat. No. 6,766,288 B1 for finding harmonically related events.

In accordance with another disclosed embodiment, partial chains identified as harmonically related (as per referenced U.S. Pat. No. 6,766,288) may be related and considered as possibly from the same source. This may be referred to as the Harmonic Domain; examples of this type are shown in FIGS. 4A, B for the sample and FIG. 12 for the fifth another sample.

Figure 5A:
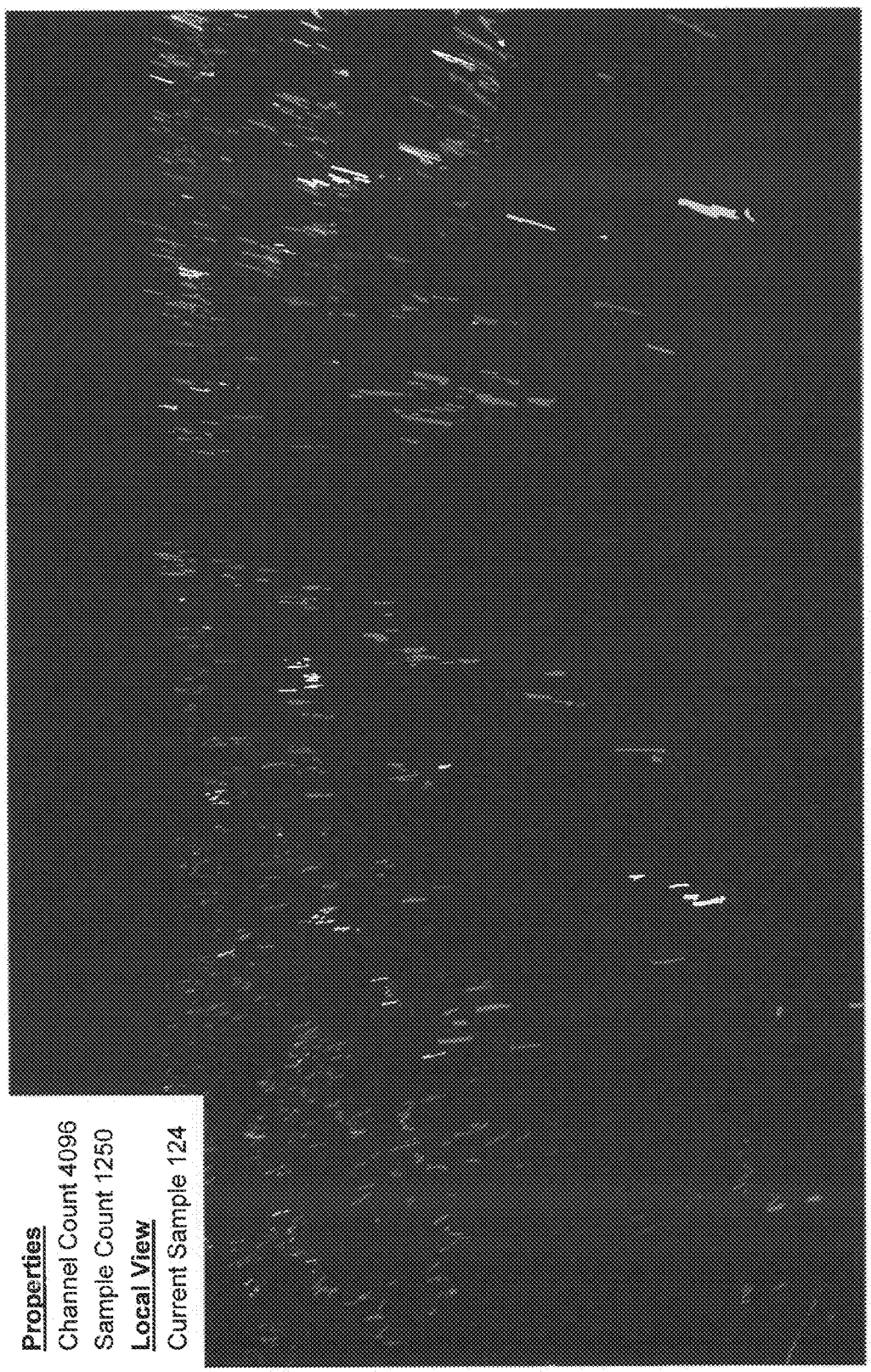
FIGS. 5A and B are three-dimensional and two-dimensional screen shots respectively of Repeating Domain events.
Figure 5B:
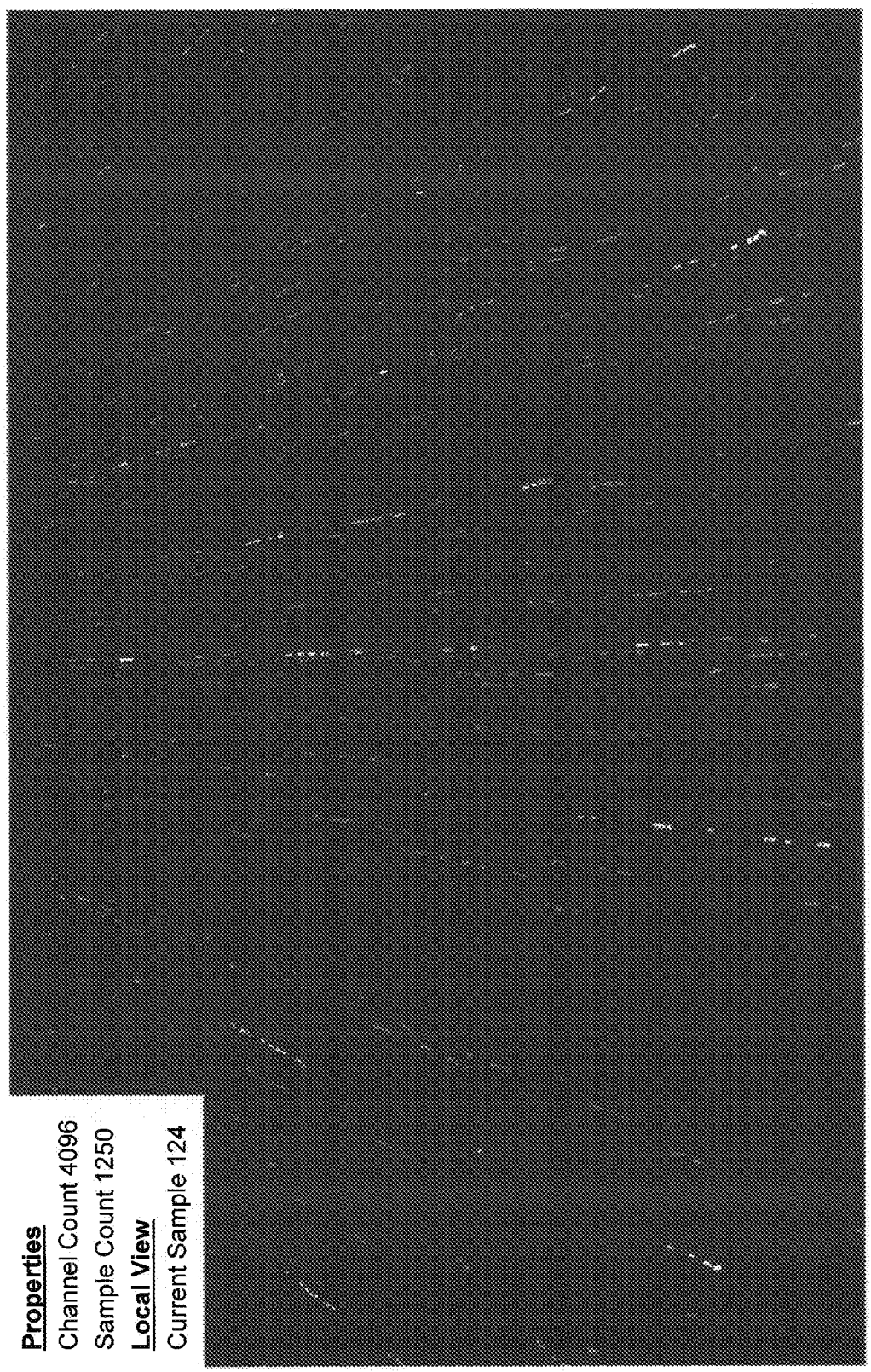

In accordance with another disclosed embodiment, a source may be known to have a certain pattern of repetition (e.g. twenty milliseconds of sound followed by 980milliseconds of silence, repeated each second, over and over). An example of such an implementation is shown in FIGS. 5A, B for another sample. That pattern could be searched for in a PMM and identified. This is an example of the Repeating Domain. The search could be restricted to an amplitude or frequency range or combined with any of the above techniques (combining domains).

In accordance with another disclosed embodiment, harmonically related chains whose fundamental frequency is in a given frequency range (as per referenced U.S. Pat. No. 6,766,288) may be identified as possibly from the source of interest. This may, again, be combined with restricting the search to an amplitude range (combining 2 domains). An example is shown in FIG. 6 for the second sample.

In accordance with another disclosed embodiment, chains that start simultaneously (or within a certain tolerance of simultaneity) may be linked together as possibly from the same source. An example is shown in FIGS. 9A, B for the third sample. This is an example of a Partial Chain Domain. If the chains are harmonically related, the evidence strengthens that they are from a single source. This may be combined with restricting the search to an amplitude range (combining 3 domains).

In accordance with another disclosed embodiment, chains that end simultaneously (or within a certain tolerance of simultaneity) may be linked together as possibly from the same source. This is another example of the Partial Chain Domain. This may also be combined with all of the above techniques (combining domains).

In accordance with another disclosed embodiment, chains of the same criteria (in time) may be identified as from the same source. An example is shown in FIG. 10 for the third sample. Similarly, a source of interest may be expected to produce chains of a certain length and so chains of that length may be identified as candidates. This is another example of the Partial Chain Domain.

In accordance with a disclosed embodiment combining different techniques, a source may be sought with a known amplitude, fundamental harmonic frequency and chain length and identify chains that match all 3 criteria as possibly from that source (combining domains).

In a similar disclosed embodiment, software and hardware implemented processes may search for any consistent repeating pattern, essentially learning over time. This search could also be combined with any of the above techniques. This is also an example of the Repeating Domain.

It should be understood that the term "pattern" may refer to many things. Software and hardware implemented processes may search for how often the pattern repeats (dot, dot, dash, pause vs. dot, dot, dash, long pause)—which might better be termed "cadence." Thus, it should also be appreciated that searching may be performed based on the way that an event is shaped.

Alternatively, software and hardware implemented processes may be most focused on the shape details of the pattern (e.g., dot, dot, dash, pause vs. dash, dash, dot, pause). These are more examples of the Repeating Domain. Moreover, the volume could change (dot, DOT, dash, pause) or the fundamental frequency (do, ra, me, pause) (combining domains) may very and software and hardware implemented processes analyze those variations.

Thus, as explained above, the combinations of different types of analytic techniques are endless (do, ra, me, long pause) and such combinations are exactly what distinguishes, for example, one birdcall from another. Just as the human ear can pick out the sound of a red-tailed hawk from a cacophony of woodland sounds, so software and hardware implemented processes provided in accordance with the disclosed embodiments may be able to identify the sound of a heart murmur from the cacophony of sounds in a fetal heart monitor. An example of the Partial Chain Domain/(angle parameter) for a heart beat is shown in FIG. 11. The angle is the angle of attack and decay of the partial chain. In a Non-random Domain, as an example, the non-random domain may be a single or multiple occurrences of detected partial chains that have non-harmonic mathematical relationships.

FIG. 1 illustrates a block diagram of various components providing functionality performed in accordance with a disclosed embodiment of the invention. Analog signal receiving module 101*a* captures a physical analog signal. The analog signal receiving module 101*a* may be, for example, a tape player playing a tape, a microphone, video camera, or other transducer, etc. An analog-to-digital (A/D) converter 101*b* converts the physical analog signal to a digital format. In one potential embodiment, the A/D converter 101*b* may be embedded, for example, on a digital audio machine that feeds a Digital Audio Workstation (DAW). The digital format may then be produced, for example, using 16-bit quantization and, for example, a sampling frequency of 8 KHz. Each bit of quantization may afford a dynamic range of approximately 6 dB. Thus, the example 16-bit quantization may lead to a total dynamic range of approximately 125 dB, which may be sufficient for some audio applications.

Other quantization options are available, including but not limited to 32-bit and 24-bit. The quantization may also be single-bit using over sampling and sigma-delta modulation, as commonly used in devices such as CD-ROMs. The analog signal receiving module 101*a* and the A/D converter 101*b* can be the same device or separate devices.

In a disclosed embodiment, instead of providing the digital signal via the analog signal receiving module 101*a* and the A/D converter 101*b*, the digital signal may be provided by data storage 102 which stores the digital signal. The data storage 102 may be any kind of data storage, for example, hard disk drives, a Network Attached Storage (NAS) device, a flash drive, etc. However, the data storage 102 is not limited to these particular examples. The data storage 102 may include other existing or future developed data storage devices without departing from the scope of the current invention.

Many types of signals may be processed utilizing the disclosed embodiments. For example, the digital signals provided may be digitized analog signals from the audio spectrum, video spectrum or other spectrums, or may originate in a digital form.

At PMM generation module 103, the digital signal may be received from the analog signal receiving module 101a and the A/D converter 101b or, for example, from the data storage 102; subsequently, it may be transformed to generate the PMM. Details of one, non-limiting example of generating the PMM are described in Patent Application No. PCT/US2009/064120 (as explained above).

The PMM output data 104 generated by the PMM generation module 103 may be in any data format. An example of data format would be binary, Technical Data Management Streaming (TDMS) format or Excel® XML format (XLSX). Any suitable data format may be used including a customized, proprietary data format.

In accordance with a disclosed embodiment, PMM output data 104 may be provided to a PMM output module 105, which may be implemented in one or more types of data storage or transmission devices configured to store or transmit the generated PMM data. For example, the PMM output module may be configured to store static files or may be configured to stream data that maybe used in "real time" applications. Furthermore, the PMM output module 105 may be implemented in part utilizing data storage to store the PMM. Alternatively, or in addition, the PMM output module 105 may be implemented in whole or in part in a transmission device configured to transmit the PMM to another device, for example, the visualization module 116. These results may then input into software running on a signal processor or other device to modify the original waveform.

In accordance with one disclosed embodiment, the river visualization module 116 may be implemented via computer hardware and software that provides a visualization device generating one or more user interfaces designed to enable the visually interpret the generated PMM data. Such user interfaces may optionally utilize touch screen technology or any other type of input and instruction control methodology associated with a Graphical User Interface (GUI).

A visualization module 116 may be, for example, implemented to include a printing device and/or display device, for example, liquid crystal displays, projection monitors, etc. It should be appreciated that visualization methodologies may not be limited to two dimensional viewers; thus, three dimensional and full holographic displays could be used. Exemplary printing devices may include toner-based printers, liquid ink-jet printers, inkless printers, etc. Other interim results of the exemplary embodiments may also be provided to the visualization module 116.

In a disclosed embodiment, the PMM output module 105 may include both data storage and a visualization device so that the signal processor can be manually adjusted to achieve the desired result.

The PMM output data 104 may be applied to various algorithms that perform sorting, qualification, and analytical functions depending on the requirements of the user and of the signals being processed. The scope and number of different analytical algorithms is not limited.

The harmonic domain calculation module 106 may apply harmonic domain calculation algorithm software to the PMM Output Data. This module's functionality enables the discovery of partial chains that are harmonically related. This functionality may be implemented in whole or in part utilizing the algorithm(s) disclosed in the Fast Find Fundamental Method, U.S. Pat. No. 6,766,288 B1.

The amplitude domain calculation module 107 may apply amplitude domain calculation algorithm software, which may enable the discovery of all partial chains defined by amplitude. Such functionality would further enable the sorting of loud partial chains from partial chains of a lesser amplitude. It would also allow the separation of partial chains having an amplitude delta. In addition, this functionality may enable the separation of signals above or below absolute thresholds.

The repeating domain calculation module 108 may apply repeating domain calculation algorithm software, which may enable the discovery of all partial chains defined by the number they repeat per frequency. Over time this functionality may further enable discovery of repeating events across time and within periods of time. In addition, the functionality may also enable location of repeating partial chains as subgroups of repeating chains.

The frequency domain calculation module 120 may apply a frequency domain calculation algorithm, which may enable discovery of partial chains within a defined frequency range or delta of frequencies.

The time domain calculation module 117 may apply a time domain calculation algorithm, which may enable discovery of partial chains defined by a range of time.

The memory domain calculation module 118 may apply a memory domain calculation algorithm configured to match/correlate partial chain/signal patterns that could be loaded from memory such as a database. In addition, partial chains that may or may not match may also be stored within the memory; it should be understood that stored partial chains may be optionally stored as new and unique partial chains stored as new patterns.

The non-random domain calculation module 119 may apply a non-random domain calculation algorithm configured to enable discovery of partial chains that may be mathematically related in ways not defined by other domains. Thus, the module 119 may also enable discovery of signals that may be embedded in noise or other natural or unnatural random signals.

The partial chain domain calculation module 109 may apply partial chain domain calculation algorithm software, which may enable discovery of all partial chains defined by, for example: (a) the coincident start time; (b) the coincident stop time; (c) the coincident partial chain length; (d) the coincident partial chain peaks; (e) the angle of partial chain amplitude increase over time; and/or (f) the angle of partial chain amplitude decrease over time. In some cases start frequency, peak frequency and end frequency may be specified. Similarly amplitude, or time maybe used.

The combination domain calculation module 110 may apply a combination of domain calculation algorithms to enable two or more domain algorithms to be implemented in combination depending on the signals being analyzed. The multiple algorithms used to provide this functionality may be applied to a combination domain output re-calculation module 111, which may run software configured to combine results generated by module 110.

The output of the combination domain output re-calculation module 111 may be input to the visualization module 116 for viewing the partial chain discovery results of the domain combinations.

The output of the combination domain output re-calculator module 111 may also be applied to a filter calculation module 112. The function of this module 112 is to build filters for use in the filter application module 113. Such a filter application module 113 may be configured to implement the output of the filter calculation module 112 to filter unwanted or wanted signals in the digital signal file. The filters may be of an FIR or IIR type but need not be limited to these types of filters. Furthermore, filter depth and bandwidth may also be part of the filter parameter controls.

The re-calculation output module 114 may be configured to be used to run the output of the filter application module 113 against the original digital signal to obtain signal difference/filtered outputs. In some cases, it may be required to use the difference signals as opposed to the absolute filtered signal. The output of the re-calculation output module 114 can be input to the river Visualization module 116. The results of the process may also be input to a multidimensional output module 116 that may be configured to enable three-dimensional or holographic display types of user interfaces. See, for example, Method of Signal Shredding, U.S. Pat. No. 6,798,886 B1, Method of Modifying Harmonic Content of a Complex Waveform, U.S. Pat. No. 7,003,120 B1.

In order to better understand the functionality of the various, afore-mentioned modules, FIG. 13 provides an alternative representation of the operation of the components previously illustrated in FIG. 1 for providing the novel domain identification and separation methodologies and functionality for precision measurement of waveforms. As shown in FIG. 13, an input signal at 1001 is provided to a signal processing module 1002. The module 1002 includes a measurement engine 1003, a marking engine 1004, and a comparing engine 1005, which effectively cooperate to produce a PMM.

It should be understand that each of these engines 1003-1005 included in the signal processing module 1002 (and the signal processing module 1002 itself) may be implemented utilizing one or more computers with at least one Central Processing Unit (CPU) and at least one memory device (not illustrated in FIG. 13 but illustrated, for example, as 102 in FIG. 1).

Further, the measurement engine 1003, marking engine 1004, and comparing engine 1005 may be implemented in whole or in part utilizing, for example, a Field Programmable Gated Array (FPGA), a Digital Signal Processing (DSP) chip, a Graphic Processing Unit (GPU), an Application Specific Integrated Circuit (ASIC), etc. Furthermore, the measurement engine 1003, marking engine 1004, and comparing engine 1005 may be implemented at least in part utilizing software modules (discussed above with reference to FIG. 1) as one or more engines and stored on computer-readable storage.

The PMM generated by the comparing engine 1005 may be provided to a multiple domain parsing engine 1006 that also may be implemented in whole or in part utilizing the hardware described above in conjunction with one or more software algorithms. The output of that multiple domain parsing engine 1006 may be, for example, a domain matrix which may be provided directly as output data 1008 (this implementation is not illustrated) or through filter engine 1007 as output data 1008. The output data 1008 may be provided to output module 1009 which stores, displays, and/or transmits the output data.

As explained throughout the present disclosure, the disclosed embodiments may be implemented utilizing software operating on one or more pieces of hardware, which may include, for example, a computer. Thus, the disclosed embodiments may run on a single processor with a single core, a single processor with multiple cores, or multiple processors with single or multiple cores. Furthermore, the software may run on one or more servers that interact with one or more user interfaces to provide visualization of the PMM data at one or more locations that may be remote to one another.

Furthermore, that software may implement the functionality disclosed herein with reference to the modules, components and engines illustrated in FIGS. 1 and 13. Some or all of the functionality provided by the disclosed embodiments may be provided using software, general or specialized digital signal processor chips, dedicated hardware, firmware, etc. Additionally, the functionality may be embodied on one or more circuit boards comprising, for example, digital signal processor chips, to be mounted in a computer or other module.

Some functionality provided by the disclosed embodiments may be implemented using parallel computing hardware. Thus, for example, a main memory of a parallel processor computing device may be either shared memory (shared between all processing elements in a single address space), or distributed memory (in which each processing element has its own local address space).

It should be appreciated that the PMM and domains, whilst being used for discovery and display and filtering, may also (or alternatively) be used for various other functions. For example, the application of the disclosed and other equivalent or similar unknown domains/criteria may be used to sift through data (PMM) in virtually any field in which data analysis is useful.

Thus, it should be understood that the functionality of the disclosed embodiments has a wide range of applications, including, but not limited to, for example, signal time-variance analysis including audio, audio spectrum analysis, signal analysis in an applicable industry in any frequency range, data compression, digital cochlea for the deaf, "voice print" information, etc. FIG. 11, for example, shows the attack and decay angles for a heartbeat.

Moreover, the functionality and technical effects provided by the disclosed embodiments may be utilized to provide new or improved inputs to other signal processors, analysis devices, algorithms, systems, and organizations. For example, records of related partial chains running across the time-frequency plane, together with the amplitudes or interpolated amplitudes along each chain, may provide a rich and concise record of the components of particular signal sources. Signals that were previously hidden by stronger signals may be measured and visualized, particularly when the partials are linked into partial chains in the PMM visual display. Output from PMM or from any of the domain criteria maybe used as "side chain" controls for existing signal discovery systems and machines.

Disclosed embodiments can be used to accurately measure sound components and parse those components apart even when the sound components are part of a compound waveform containing a mixture of sounds. Further, disclosed embodiments may also be used, for example, for compound waveforms containing sounds even when the sounds come in short or long duration bursts and/or are changing in pitch and/or in amplitude.

The examples and embodiments described herein are non-limiting examples. The embodiments described in detail with respect to exemplary embodiments, and to those skilled in the art should be apparent from the foregoing that changes and modifications may be made without departing from the invention in its broader aspects, and the invention, therefore, as defined in the claims is intended to cover all such changes and modifications as fall within the true spirit of the invention.

What is claimed is:

1. A method for digital signal processing, implemented on a computer having one or more processors and one or more memory devices, the method comprising:
   receiving a digital waveform signal from data storage or from conversion of a physical analog signal received from an analog source or captured by a physical analog device;
   determining two or more measuring matrices from the digital waveform, each matrix consisting of a plurality of cells, each cell representing a corresponding time slice and frequency bin and having an amplitude corresponding to the signal energy for that frequency bin and time slice;
   identifying various types of maximum cells in each measuring matrices based on their having a local maximum amplitude;
   identifying correlated maxima as maximum cells from multiple measuring matrices that coincide in time and frequency or multiplies type of maxima or a combination of measuring matrices;
   constructing a correlated maxima matrix that indicates the correlated maxima;
   identifying, in the correlated maxima matrix, at least one of the following domain relationships of the correlated maxima: time domain, frequency domain, harmonic domain, amplitude domain, partial chain domain, repeating domain, memory domain, non-random domain;
   constructing a domain matrix showing the identified domain relationship; and
   outputting the domain matrix to thereby reveal information associated with the input signal, wherein outputting includes at least one of storing, transmitting and/or displaying the domain matrix,
   wherein the receiving, determining, identifying maximum cells identifying correlated maxima, constructing and outputting are performed by one or more processors.

2. The method of claim 1, further comprising displaying the domain matrix on a graphical user interface in a three-dimensional format.

3. The method of claim 2, wherein the visualization format illustrates data associated with different frequencies using different colors.

4. The method of claim 2, wherein the visualization format illustrates amplitude by height and color is shown lighter as amplitude increases.

5. The method of claim 1, wherein identifying a partial chain domain relationship further comprises identifying maxima cells in the correlated maxima matrix which are adjacent in time or frequency axis to each other and:
   are adjacent within a preselected number of cells;
   are of a minimum number of adjacent cells in length; or
   are less than a maximum amplitude change between adjacent cells.

6. The method of claim 1, wherein identifying a partial chain domain further comprises identifying partial chains in a first axis that:
   are partial chains that repeats a minimum number of occurrences in a second axis;
   are partial chains that one or more start, stop and peak in a common window in the second axis;
   are portions of partial chains that are harmonically related; or
   are partial chains whose amplitude has a preselected rate of change or angle.

7. The method of claim 1, wherein identifying a harmonic domain relationship further comprises identifying maxima in the correlated maxima matrix which are harmonically related and meet one of the following criteria:
   have an amplitude in a preselected range;
   repeats a minimum number of occurrences; and
   have a minimum number of harmonics present.

8. The method of claim 1, further comprising analyzing one of the correlated matrix and the domain matrix and adjusting parameters used in determining the measuring matrix based on the analysis.

9. The method of claim 1, further comprising filtering the discovered chains for isolation or noise removal.

10. The method of claim 1, further comprising combinations of domains for the multi-domain discovery.

11. A computer readable storage medium having program instructions stored thereon that, when executed by a processor, cause the processor to:
    receive a digital waveform signal from data storage or from conversion of a physical analog signal received from an analog source or captured by a physical analog device;
    determine two or more measuring matrices from the digital waveform, each matrix consisting of a plurality of cells, each cell representing a corresponding time slice and frequency bin and having an amplitude corresponding to the signal energy for that frequency bin and time slice;
    identify various types of maximum cells in each measuring matrices based on their having a local maximum amplitude;
    identify correlated maxima as maximum cells from multiple measuring matrices that coincide in time and frequency or multiplies type of maxima or a combination of measuring matrices;
    construct a correlated maxima matrix that indicates the correlated maxima;
    identify, in the correlated maxima matrix, at least one of the following domain relationships of the correlated maxima: time domain, frequency domain, harmonic domain, amplitude domain, partial chain domain, repeating domain, memory domain, non-random domain;
    construct a domain matrix showing the identified domain relationship; and
    output the domain matrix to thereby reveal information associated with the input signal, wherein outputting includes at least one of storing, transmitting and/or displaying the domain matrix,
    wherein the receiving, determining, identifying maximum cells identifying correlated maxima, constructing and outputting are performed by one or more processors.

12. The computer readable storage medium of claim 11, wherein the program instructions further comprise computer readable code that causes the processor to display the domain matrix on a graphical user interface in a three-dimensional format.

13. The computer readable storage medium of claim 12, wherein the program instructions further comprise computer readable code that causes the processor to display the domain matrix on a graphical user interface using a visualization format that illustrates data associated with different frequencies using different colors.

14. The computer readable storage medium of claim 12, wherein the program instructions further comprise computer readable code that causes the processor to display the domain matrix on a graphical user interface using a visualization format that illustrates amplitude by height and with color that is shown lighter as amplitude increases.

15. The computer readable storage medium of claim 11, wherein the program instructions further comprise computer readable code that causes the processor to identify a partial chain domain relationship by identifying maxima cells in the correlated maxima matrix which are adjacent in time or frequency axis to each other and:
- are adjacent within a preselected number of cells;
- are of a minimum number of adjacent cells in length; or
- are less than a maximum amplitude change between adjacent cells.

16. The computer readable storage medium of claim 11, wherein the program instructions further comprise computer readable code that causes the processor to identify a partial chain domain by identifying partial chains in a first axis that:
- are partial chains that repeats a minimum number of occurrences in a second axis;
- are partial chains that one or more start, stop and peak in a common window in the second axis;
- are portions of partial chains that are harmonically related; or
- are partial chains whose amplitude has a preselected rate of change or angle.

17. The computer readable storage medium of claim 11, wherein the program instructions further comprise computer readable code that causes the processor to identify a harmonic domain relationship by identifying maxima in the correlated maxima matrix which are harmonically related and meet one of the following criteria:
- have an amplitude in a preselected range;
- repeats a minimum number of occurrences; and
- have a minimum number of harmonics present.

18. The computer readable storage medium of claim 11, wherein the program instructions further comprise computer readable code that causes the processor to analyze one of the correlated matrix and the domain matrix and adjust parameters used in determining the measuring matrix based on the analysis.

19. The computer readable storage medium of claim 11, wherein the program instructions further comprise computer readable code that causes the processor to filter the discovered chains for isolation or noise removal.

20. A signal processing system implemented on a computer having one or more processors and one or more memory devices, the signal processing system comprising:
- a measurement engine configured to:
  - receive a digital waveform signal from data storage or from conversion of a physical analog signal received from an analog source or captured by a physical analog device; and
  - determine two or more measuring matrices from the digital waveform, each matrix consisting of a plurality of cells, each cell representing a corresponding time slice and frequency bin and having an amplitude corresponding to the signal energy for that frequency bin and time slice;
- a comparing engine configured to:
  - identify various types of maximum cells in each measuring matrices based on their having a local maximum amplitude; and
  - identify correlated maxima as maximum cells from multiple measuring matrices that coincide in time and frequency or multiplies type of maxima or a combination of measuring matrices;
- a marking engine configured to:
  - construct a correlated maxima matrix that indicates the correlated maxima;
  - identify, in the correlated maxima matrix, at least one of the following domain relationships of the correlated maxima: time domain, frequency domain, harmonic domain, amplitude domain, partial chain domain, repeating domain, memory domain, non-random domain;
  - construct a domain matrix showing the identified domain relationship; and
- an output module configured to output the domain matrix to thereby reveal information associated with the input signal, wherein outputting includes at least one of storing, transmitting and/or displaying the domain matrix.

21. The system of claim 20, wherein the output module further comprises a graphical user interface configured to display the domain matrix in a three-dimensional format.

22. The system of claim 21, wherein the graphical user interface is further configured to display data associated with different frequencies using different colors.

23. The system of claim 21, wherein the graphical user interface is further configured to display data associated amplitude by height and color is shown lighter as amplitude increases.

24. The system of claim 20, wherein the marking engine is further configured to identify a partial chain domain relationship by identifying maxima cells in the correlated maxima matrix which are adjacent in time or frequency axis to each other and:
- are adjacent within a preselected number of cells;
- are of a minimum number of adjacent cells in length; or
- are less than a maximum amplitude change between adjacent cells.

25. The system of claim 20, wherein the marking engine is further configured to identify a partial chain domain relationship by identifying partial chains in a first axis that:
- are partial chains that repeats a minimum number of occurrences in a second axis;
- are partial chains that one or more start, stop and peak in a common window in the second axis;
- are portions of partial chains that are harmonically related; or
- are partial chains whose amplitude has a preselected rate of change or angle.

26. The system of claim 20, wherein the marking engine is further configured to identify a harmonic domain relationship by identifying maxima in the correlated maxima matrix which are harmonically related and:
- have an amplitude in a preselected range;
- repeats a minimum number of occurrences; or
- have a minimum numbers of harmonics present.

27. The system of claim 20, wherein the comparing engine and the measurement engine are further configured to analyze one of the correlated matrix and the domain matrix and to adjust parameters used in determining the measuring matrix based on the analysis.

28. The system of claim 20, wherein the marking engine is further configured to consider combinations of domains for the multi-domain discovery and to filter the discovered chains for isolation or noise removal.

* * * * *